US007184478B2

(12) United States Patent
Popescu et al.

(10) Patent No.: US 7,184,478 B2
(45) Date of Patent: Feb. 27, 2007

(54) HIGH SPEED CIRCUITS FOR ELECTRONIC DISPERSION COMPENSATION

(75) Inventors: Petre Popescu, Ottawa (CA); Quoc Hai Tran, Ottawa (CA); Douglas Stuart McPherson, Ottawa (CA)

(73) Assignee: Applied Micro Circuits Corporation, San Diego, CA (US)

( * ) Notice: Subject to any disclaimer, the term of this patent is extended or adjusted under 35 U.S.C. 154(b) by 735 days.

(21) Appl. No.: 10/638,386

(22) Filed: Aug. 12, 2003

(65) Prior Publication Data
US 2004/0258183 A1 Dec. 23, 2004

Related U.S. Application Data

(60) Provisional application No. 60/479,459, filed on Jun. 19, 2003.

(51) Int. Cl.
*H03H 7/40* (2006.01)
(52) U.S. Cl. .................. 375/233; 375/229; 375/232
(58) Field of Classification Search ............... 375/229, 375/232, 233, 234, 316, 346, 348; 708/100, 708/200, 300, 322, 323
See application file for complete search history.

(56) References Cited

U.S. PATENT DOCUMENTS

| 6,243,183 | B1 | 6/2001 | Enfors |
| 7,035,361 | B2 * | 4/2006 | Kim et al. .................. 375/350 |
| 2001/0040922 | A1 | 11/2001 | Buchali |
| 2001/0043649 | A1 | 11/2001 | Farjad-Rad |
| 2003/0011847 | A1 | 1/2003 | Dai |
| 2003/0016091 | A1 | 1/2003 | Casper |
| 2003/0189996 | A1 | 10/2003 | Shanbhag |
| 2003/0189997 | A1 | 10/2003 | Shanbhag |
| 2003/0189998 | A1 | 10/2003 | Phanse |

OTHER PUBLICATIONS

David Johns and Ken Martin, "Analog Integrated Circuit Design", p. 142-144, John Wiley&Sons, 1997.
"Electronic Dispersion Compensation" by A. Gandhi and S. Behtash et al., Santel Networks Inc., 2002.
"Reduction of the Chromatic Dispersion Penalty at 10Gbit/s by Integrated Electronic Equalisers" by F. Bichali et al, Optical Fiber Communications Conference 2000, vol. 3, pp. 268-270.
"Equalization and FEC techniques for Optical Transceivers" by K. Azadet et al., Journal of Solid State Circuits, vol. 37, No. 3, pp. 317-327, Mar. 2002.

(Continued)

*Primary Examiner*—Pankaj Kumar
*Assistant Examiner*—Naheed Ejaz
(74) *Attorney, Agent, or Firm*—Law Office of Gerald Maliszewski; Gerald Maliszewski

(57) ABSTRACT

The invention describes a number of differential, balanced high-speed circuits that permit the design of a receiver with Electronic Dispersion Compensation (EDC) on a single semiconductor substrate, including the functions of an analog Fast Forward Equalizer (FFE), a Clock and Data Recovery, a Decision Feedback Equalizer (DFE), enhanced by additional circuits that permit control of the slicing level to compensate for pulse distortion, and control of the phase offset to set the optimal eye sampling time when a distorted signal is received. To provide the high speed of operation, all circuits including the phase locked loop, operate as differential circuits, which include a number of improvements in the design of the charge pump, the decision feedback equalizer, the slicing level control, and others.

21 Claims, 17 Drawing Sheets

OTHER PUBLICATIONS

"MMIC Adaptive Transversal Filtering Using Gilbert Cells and is Suitable for High-Speed Lightwave Systems" by J. Lee and A.P. Freundorfer, IEEE Photonics Technology Letters, vol. 12, No. 2, Feb. 2000.

"An arbitrary Fast Processing Architecture for Decision Feedback Equalizers" by Meng-Lin Yu and K. Azadet, Proceeding VLSI Technology Systems and Applications Conference, 1999, pp. 175-178.

"Electronics holds the key to low-cost compensation", FiberSystems Europe, Dec. 2002, p. 15.

"Eyemax" technology for Enhanced Forward Error Correction and Dispersion Compensation, a marketing material distributed by Applied Micro Circuits Corporation.

BigBear Networks Inc. marketing materials on electronic equalization.

Scintera's Electronic Dispersion Compensation Engine, a marketing material by Scintera Networks Inc.

"Electrical Signal Processing techniques in Long-Haul Fiber-Optic Systesm" by J.H. Winters and R.D. Gitlin, Trans. on Commun., vol. 38, No. 9, pp. 1439-1452, 1990.

\* cited by examiner

Differential Analog Multiplier

Differential Three-input Adder

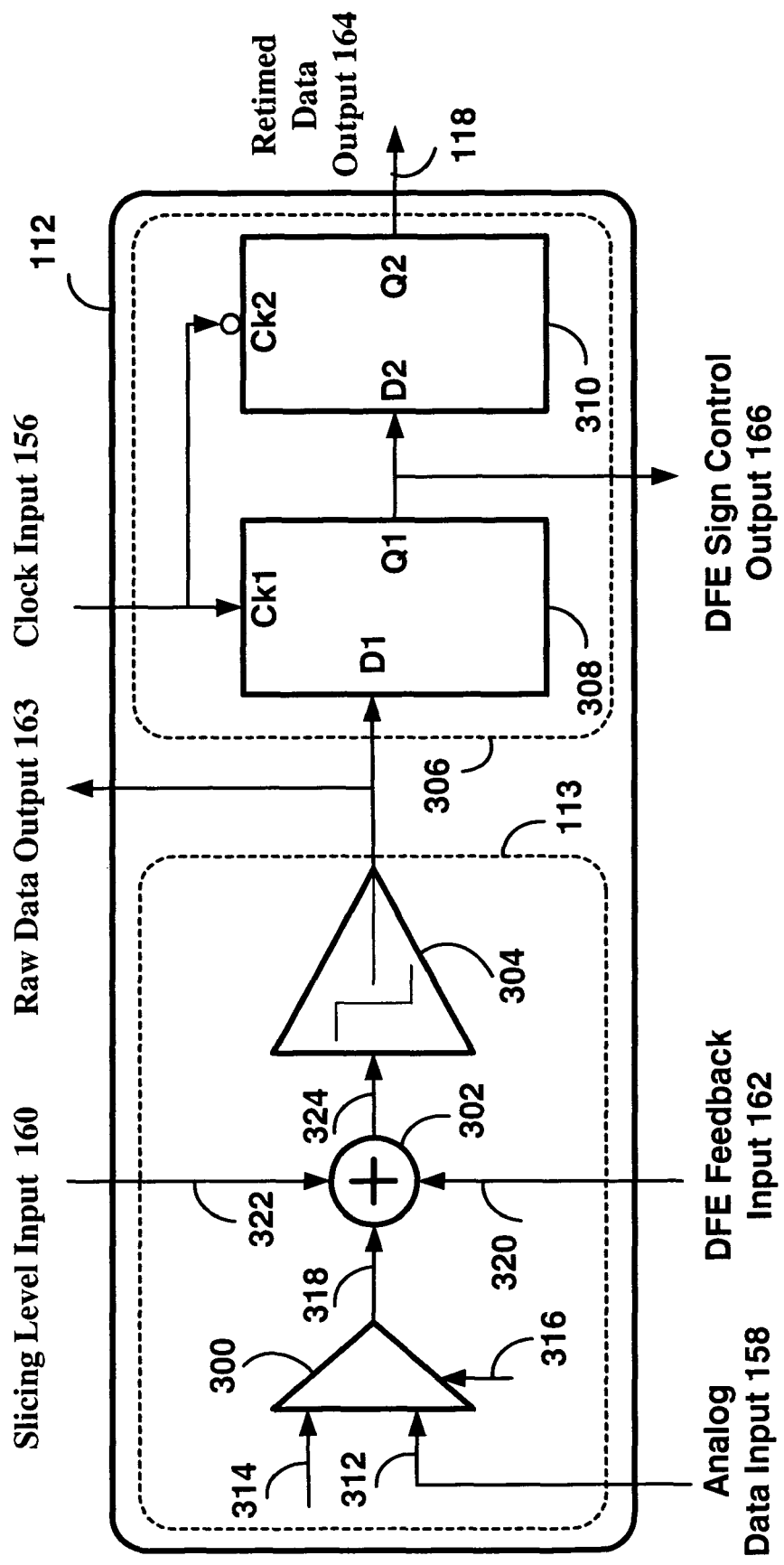
FIG. 8 Data Recovery

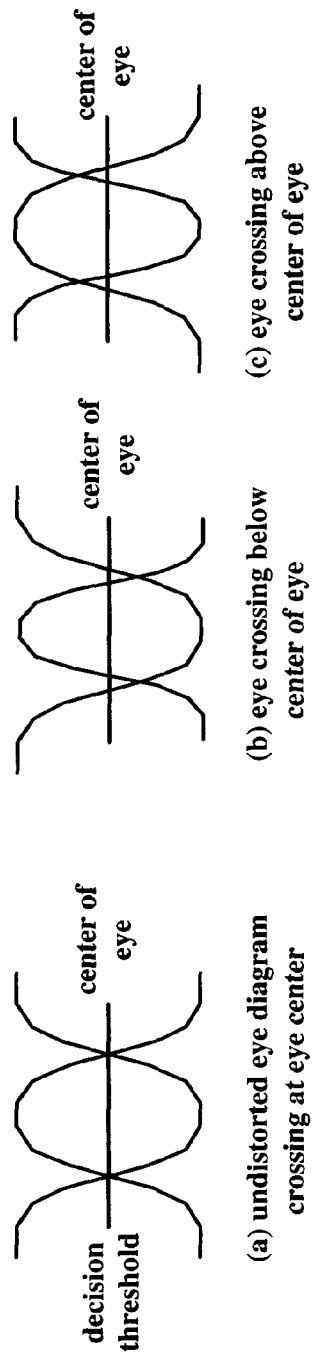
FIG. 9 Pulse Width Distortion
(a) undistorted eye diagram crossing at eye center
(b) eye crossing below center of eye
(c) eye crossing above center of eye
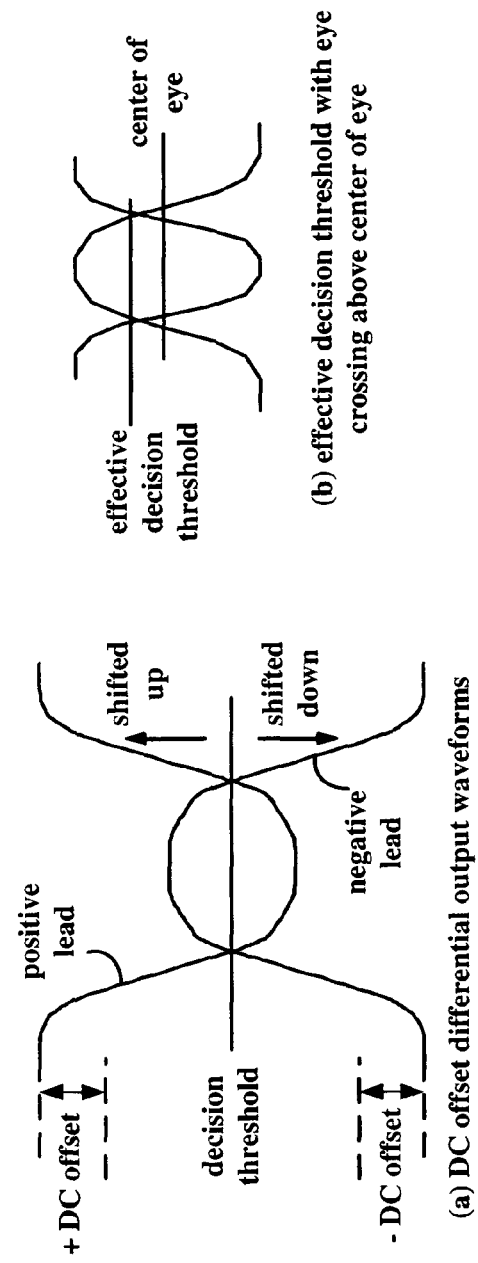
FIG. 10 Shifted Differential Waveforms
(a) DC offset differential output waveforms
(b) effective decision threshold with eye crossing above center of eye

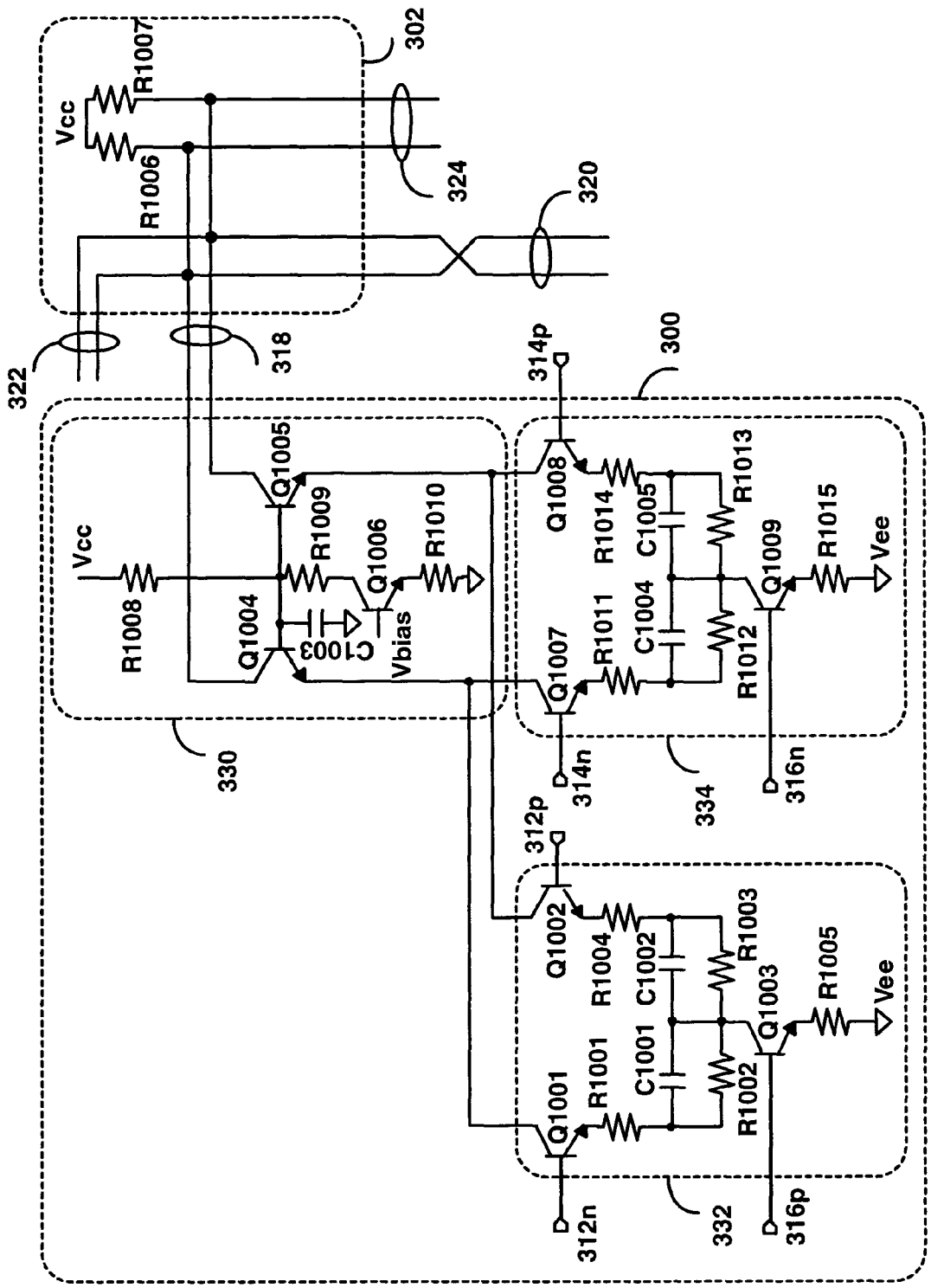
FIG. 12 Comparator and Adder Stage

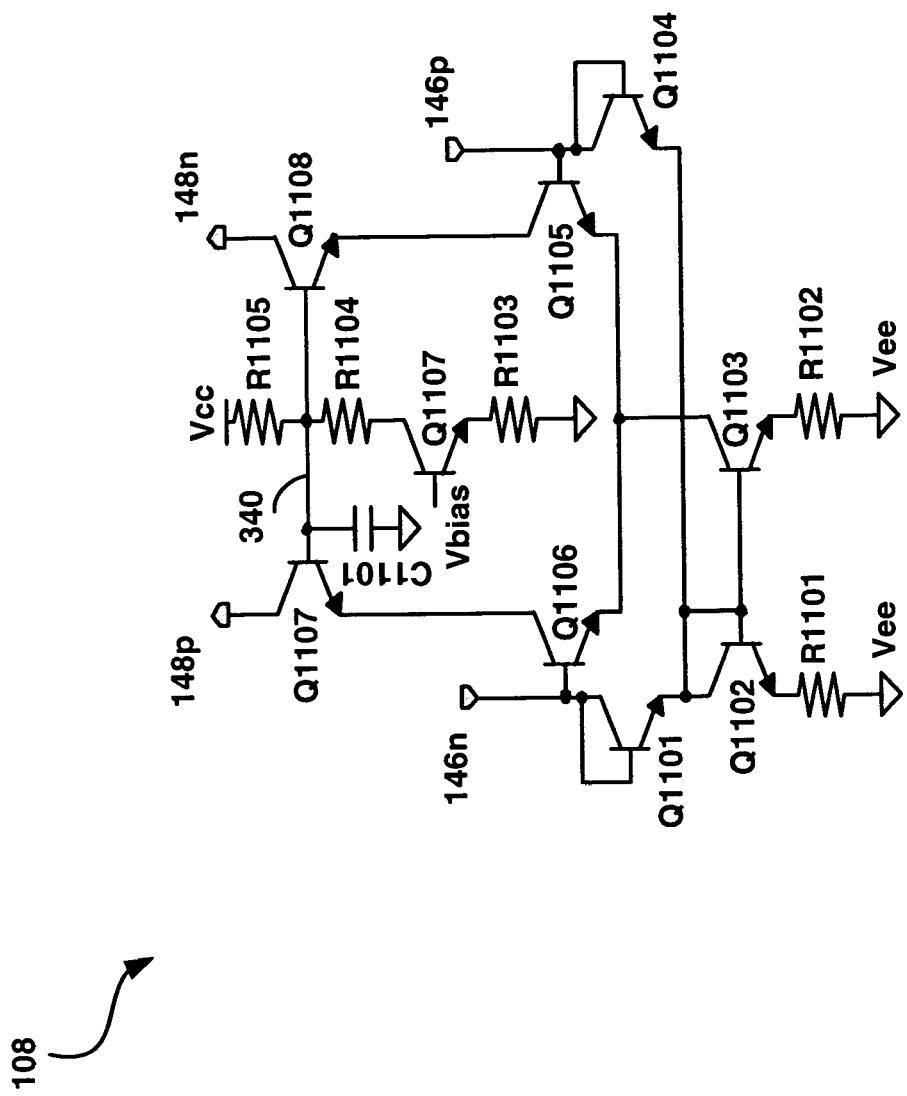
FIG. 13 Slicing Level Control Circuit

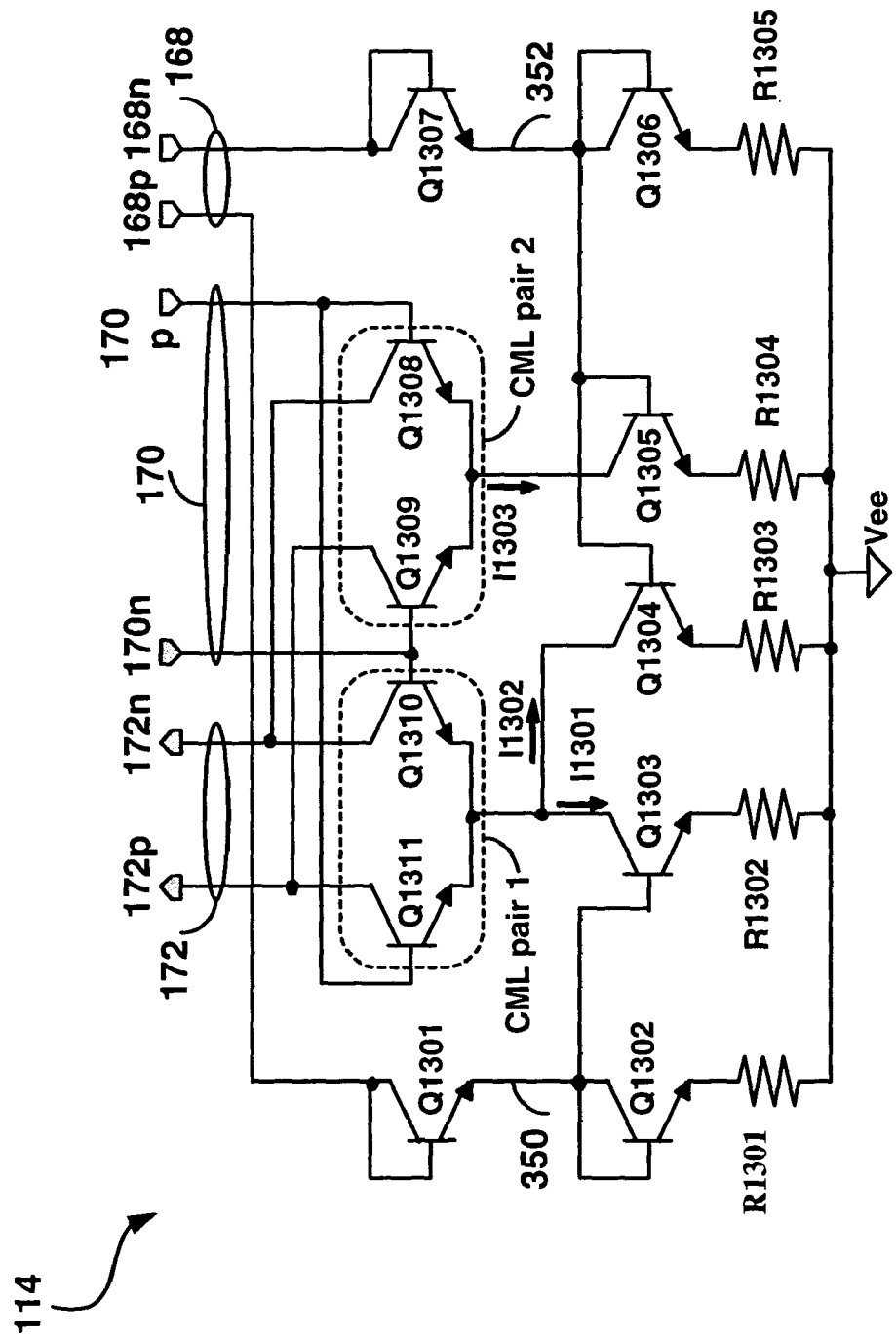
FIG. 14 DFE Circuit

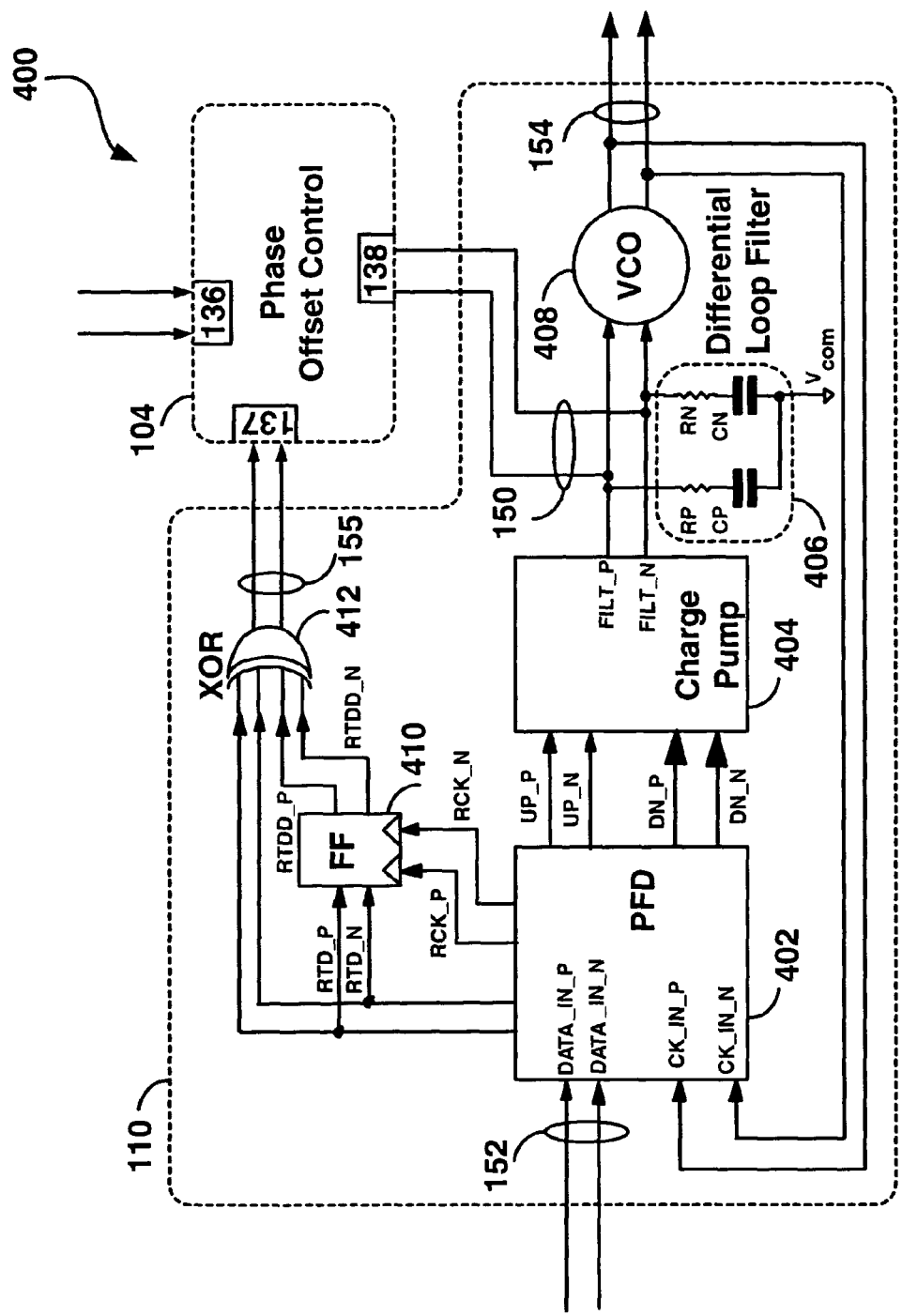
FIG. 15 Clock Recovery with Phase Offset Control

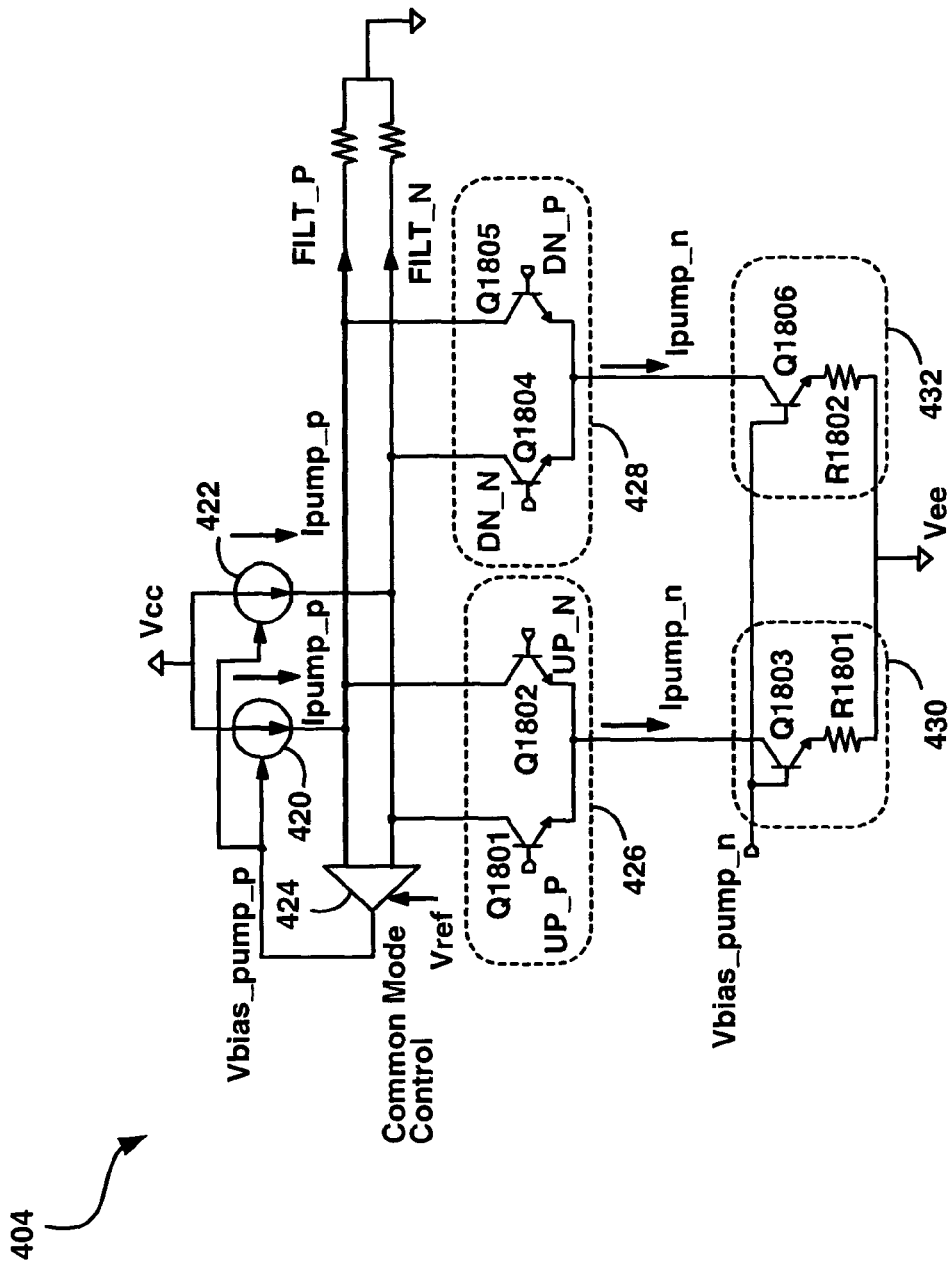
*FIG. 16 Charge Pump*

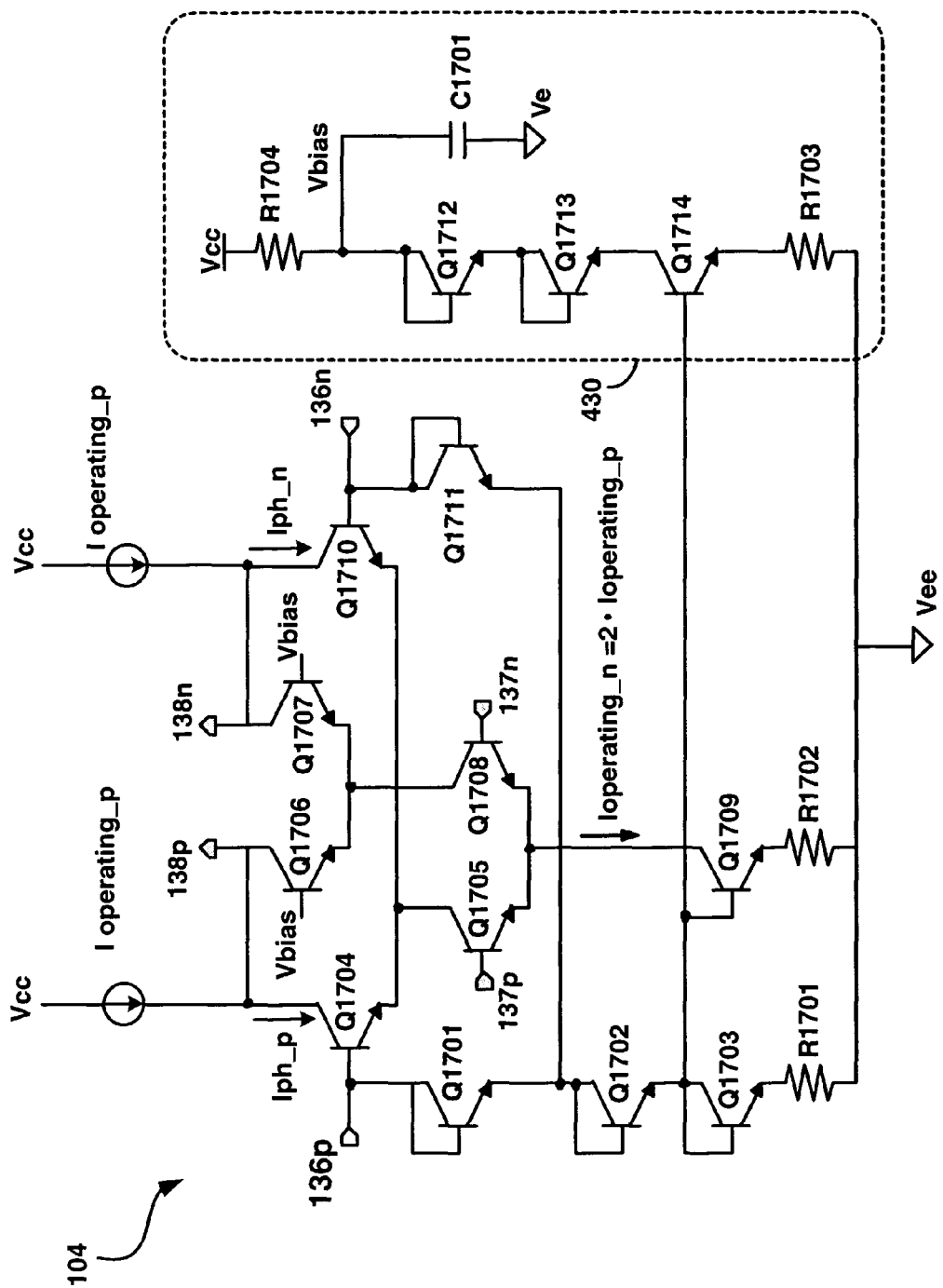
*FIG. 17 Phase Offset Control*

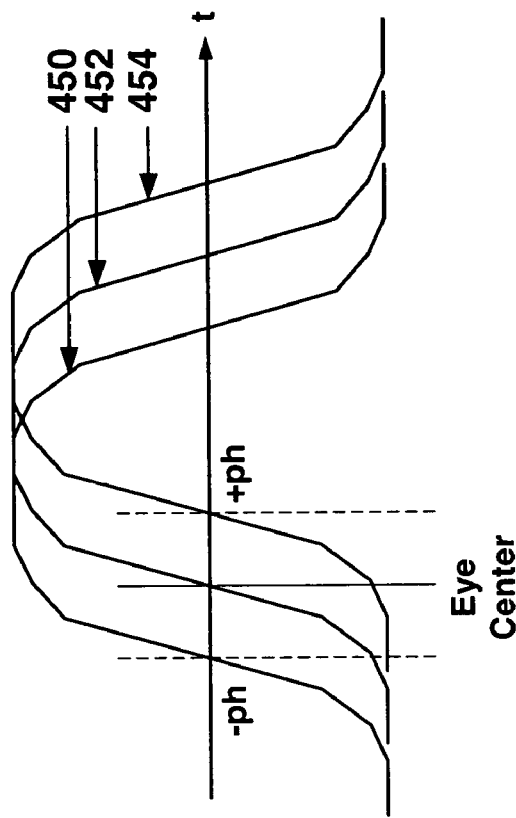
FIG. 19 Sampling Edge with and without Applied Phase Offset
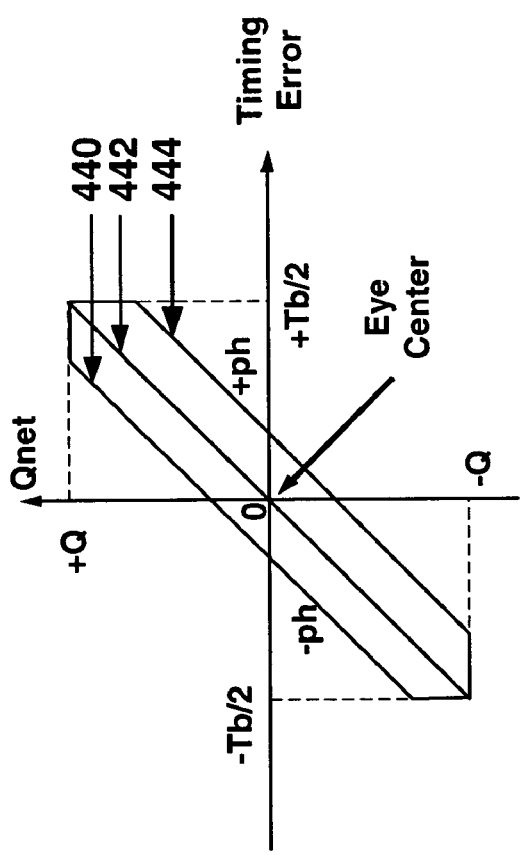
FIG. 18 Linear Phase Detector Characteristic

HIGH SPEED CIRCUITS FOR ELECTRONIC DISPERSION COMPENSATION

RELATED APPLICATIONS

The present application claims the benefit of U.S. Provisional Application Ser. No. 60/479,459 to Popescu et al, filed on Jun. 19, 2003, and entitled "High Speed Circuits for Electronic Dispersion Compensation (EDC)".

The present application is related to the U.S. patent application Ser. No. 10/638,387, entitled "A Differential Receiver Circuit with Electronic Dispersion Compensation", invented by Popescu, Gradinaru et al., and the U.S. patent application Ser. No. 10/638,340, entitled "A Differential Receiver Circuit with Electronic Dispersion Compensation for Optical Communications Systems", invented by Popescu, McPherson et al., filed concurrently herewith and incorporated herein by reference.

FIELD OF THE INVENTION

The invention relates to electronic circuits and, in particular, to high speed circuits for electronic dispersion compensation.

BACKGROUND OF THE INVENTION

In digital communications systems, the signal to noise ratio (SNR) is used to predict the BER (bit error rate). In order to improve the signal to noise ratio, noise sources must be understood and the noise level minimized when possible. It is also important that the signal power to be maximized at the decision point for the bit under consideration.

A well known impairment that degrades this concentration of signal power at the decision point in fiber optic communications systems is dispersion. The dispersion effect can be explained if we assume that the transmitted signal can be represented as the sum of its components. Chromatic dispersion, polarization mode dispersion, and modal dispersion are the most common types of dispersion. These components cause small differences in propagation characteristics through the fiber. The received signal is affected by the sum of these components, resulting in inter symbol interference (ISI) by spreading the energy of each optical pulse over neighboring bits. The dispersion can thus cause bit errors in the receiver by confusing 1s and 0s.

Dispersion is present in all optical systems, but its effects become worse over longer spans and at higher transmission speeds. Long-haul systems already incorporate optical compensation elements to correct for chromatic and polarization dispersion compensation. A new alternative is electronic compensation. Electronic Dispersion Compensation (EDC) circuits have been proposed as a lower cost and lower power solution, see e.g. papers by A. Gandhi and S. Behtash, Electronic Dispersion Compensation, Santel Networks Inc., 2002; F. Buchali et al., Reduction of the chromatic Dispersion Penalty at 10 Gbit/s by Integrated Electronic Equalisers, Optical fiber Communication Conference 2000, volume 3, pp.268–270; K. Azadet et al., Equalization and FEC Techniques for Optical Transceivers, Journal of Solid-State Circuits, Vol. 37, No. 3, pp. 317–327, March 2002; J. Lee and A. P. Freudorfer, MMIC Adaptive Transversal Filtering Using Gilbert Cells and is Suitable for High-Speed Lightwave Systems, IEEE Photonics Technology Letters, Vol. 12, No 2, February 2000; Meng-Lin Yu et al., An Arbitrary Fast Block processing Architecture for Decision Feedback Equalizers, Proceedings VLSI Technology Systems and Applications Conference 1999, pp.175–178; and an article "Electronics holds the key to low-cost compensation", Fibre-eSystems Europe, December 2002, p. 15; in patent applications to Farjad-Rad entitled "Analog N-Tap FIR Receiver Equalizer" Pub. No. U.S. 2001/0043649 published Nov. 22, 2001 and to Casper entitled "Equalization of a transmission line signal using a variable offset comparator, Pub. No. U.S. 2003/0016091 published Jan. 23, 2003; and in certain marketing materials, e.g. description of "Eyemax" technology distributed by Applied Micro Circuits Corporation, and other marketing materials for electronic equalization distributed by BigBear Networks Inc., and for Electronic dispersion compensation engine distributed by Scintera Networks Inc.

A typical fiber optic communications system 10 with electronic dispersion compensation is illustrated in FIG. 1. Such a system includes a Transmitter 12, coupled to an electro-optic (E/O) converter 14, a fiber link 16, an opto-electrical (O/E) converter 18, an electronic dispersion compensation (EDC) receiver 20, and an electronic dispersion compensation (EDC) controller 22.

A digital bit stream 24 from the transmitter 12 is sent to the E/O converter 14. The output of the E/O converter 14 is an optical signal 26 to be transmitted over the fiber link 16. The output of the fiber link 16 is an optical signal 28, coupled to the input of the O/E converter 18.

The output signal of the O/E converter 18 is an analog signal 30. The EDC Receiver 20 receives the analog signal 30, and outputs a digital data signal 32 and a recovered clock 34. The digital data signal 32 may be coupled to an input of the EDC controller 22 (dotted line), the output of which is a set of control signals 36, coupled to a control input 38 of the EDC Receiver 20.

As described above, impairments caused by dispersion distort the signal transmitted by the fiber link 16. As a result, the analog signal 30 at the output of the O/E Converter 18 is not an exact replica of the digital bit stream 24 that was sent by the transmitter 12.

The purpose of the EDC Receiver 20 is to process the analog signal 30 into the digital data signal 32, to be an error free (as much as possible) representation of the original digital bit stream 24. The method used by the EDC Receiver 20 is generally based on the idea of reversing the impairment (dispersion) caused by the fiber link.

The article "Electronic Dispersion Compensation" by A. Gandhi and S. Behtash, Santel Networks Inc., 2002, illustrates this concept in some detail, FIGS. 1a and 1b of that reference showing a possible EDC Receiver. Main components of the EDC receiver of the prior art reference are a Feed Forward Equalizer (FFE) and a Decision Feedback Equalizer (DFE). The characteristics of both the FFE and the DFE depend on the setting of weight factors. These weight factors are included in the set of control signals 36 in FIG. 1.

The weight factors may be statically set by the EDC controller 22, or may be algorithmically derived, for example by analyzing the received digital data signal 32. The detailed functionality of the EDC controller 22 is outside the scope of this document.

While the concept of Electronic Dispersion Compensation including FFE and DFE has been proposed and described in a number of theoretically oriented papers, or in industry survey articles, the realization of practical receivers with Electronic Dispersion Compensation, especially when considering high data rates of 10 Gb/s and more, still require the development of new circuits that achieve this function economically while consuming as little power as possible.

SUMMARY OF THE INVENTION

Therefore it is an object of the invention to provide a differential receiver circuit with electronic dispersion compensation, which would avoid or minimize the shortcomings of the prior art.

According to one aspect of the invention there is provided a receiver circuit, comprising:

a differential analog feed forward equalizer (FFE) circuit for receiving a dispersion distorted analog signal and processing the received signal to generate an equalized analog data signal (dispersion compensated signal);

a differential clock and data recovery (CDR) circuit for receiving the equalized analog data signal and processing the received equalized analog data signal to generate a recovered clock signal, a decision feedback equalizer (DFE) sign control signal, and a retimed digital data signal;

a differential analog slicing level control circuit providing a slicing level input signal to the CDR circuit for adding a static offset to the equalized analog data signal from the FFE; and a differential analog DFE circuit processing the DFE sign control signal into a DFE feedback signal supplied to the CDR circuit for adding a dynamic offset to the equalized analog data signal.

The FFE is a finite impulse response (FIR) filter with adjustable tap weights, the tap weights having been set to substantially or partially provide dispersion compensation of the signal.

Beneficially, the differential slicing level control circuit has means for generating the slicing level input signal in the form of a differential current; and the DFE circuit has means for generating the DFE feedback signal in the form of a differential current, the polarity of said differential current being controlled by the DFE sign control signal.

The CDR circuit comprises:

a data discriminator and a flip flop;

the data discriminator receiving the equalized analog data signal from the FFE, the slicing level input signal and the DFE feedback signal, combining said three analog signals and processing them into a raw data signal which is a digital signal;

the flip flop receiving said raw data signal and the recovered clock signal to generate the DFE sign control signal and the retimed data signal.

The flip flop has a master stage and a slave stage; the master stage generating the DFE sign control signal, and the slave stage generating the retimed data signal; and the data discriminator comprises a comparator, an adder stage and a decision circuit;

the comparator converting the equalized analog data signal into a differential current; said differential current being supplied to the adder stage along with the slicing level input signal and the DFE feedback signal, both in the form of the differential currents, an output of the adder stage being a differential analog voltage signal;

the decision circuit receiving said differential analog voltage signal and converting it into the raw data signal.

Conveniently, the adder stage comprises two resistors only, to which said differential currents are supplied to generate said differential analog voltage signal.

The DFE circuit comprises:

a switching means, and a first, second and third single ended current sources, the first and second current sources being connected in parallel;

the currents flowing through said current sources being controlled by a differential DFE weight signal, having first and second single ended signals, supplied from a corresponding first and second DFE weight terminal; the first current source being controlled by the first single ended DFE weight signal, and the second and third current sources being controlled by the second single ended DFE weight signal;

the differential DFE feedback signal being supplied to a first and a second DFE feedback terminal;

the switching means providing a connection between said current sources and the DFE feedback terminals in one of the first and second states, the states being selected by the DFE sign control signal.

In the first state the first and second current sources are connected to the first DFE feedback terminal, and the third current source is connected to the second DFE terminal; and in the second state the first and second current sources are connected to the second DFE feedback terminal, and the third current source is connected to the first DFE terminal.

According to another aspect of the invention there is provided a differential receiver circuit, comprising:

a differential analog feed forward equalizer (FFE) circuit for receiving a distorted analog signal and processing the received signal to generate an equalized analog data signal (compensated signal);

a differential clock and data recovery (CDR) circuit for receiving the equalized analog data signal and processing the received equalized analog data signal to generate a recovered clock signal, a decision feedback equalizer (DFE) sign control signal, and a retimed digital data signal;

and a differential analog DFE circuit processing the DFE sign control signal into a DFE feedback signal supplied to the CDR circuit for adding a dynamic offset to the equalized analog data signal from the FFE, the DFE circuit having a means for generating the DFE feedback signal in the form of a differential current, the polarity of said differential current being controlled by the DFE sign control signal.

According to yet another aspect of the invention there is provided a receiver circuit, comprising:

a differential analog feed forward equalizer (FFE) circuit for receiving a dispersion distorted analog signal and processing the received signal to generate an equalized analog data signal (dispersion compensated signal);

a differential clock and data recovery (CDR) circuit for receiving the equalized analog data signal and processing the received equalized analog data signal to generate a recovered clock signal, a decision feedback equalizer (DFE) sign control signal, a retimed digital data signal, and a phase offset enable signal;

a differential analog slicing level control circuit providing a slicing level input signal to the CDR circuit for adding a static offset to the equalized analog data signal from the FFE;

a differential analog DFE circuit processing the DFE sign control signal into a DFE feedback signal supplied to the CDR circuit for adding a dynamic offset to the equalized analog data signal; and a differential phase offset control circuit for adjusting the phase at which the equalized analog data signal is sampled by the CDR circuit in response to the phase offset enable signal.

In the receiver circuit described above, the FFE circuit comprises:

a differential tapped delay line having a delay line input, "n-1" delay elements and "n" output taps, the delay line receiving the dispersion distorted analog signal at the delay line input and producing progressively delayed signals at the output taps;

"n" differential analog multipliers for multiplying the respective delayed signals with corresponding tap weights into "n" multiplied signals;

a balanced summing tree having a plurality of differential analog adders for summing said "n" multiplied signals into the equalized analog data signal at the output of the summing tree, which is the output of the FFE; the balanced summing tree being arranged so that each multiplied signal is passing through the same number of adders before reaching the output of the FFE.

Advantageously, the physical layout of the FFE circuit is arranged so that the propagation delay from each of the "n" output taps of the delay line to the FFE circuit output is substantially the same.

Beneficially, the receiver circuit has the phase offset control circuit, which comprises a means for generating a differential offset current proportional to a phase offset control signal and enabled by the phase offset enable signal; and the CDR circuit comprises means for generating the phase offset enable signal in the form of a pulse coincident with an edge of the retimed data signal.

The phase offset control circuit comprises a current source generating a single ended current; and a means for splitting the generated single ended current into two single ended currents, whose difference forms the differential offset current.

In the embodiment of the invention, the differential slicing level control circuit has means for generating the slicing level input signal in the form of a differential current, and another means for generating the DFE feedback signal in the form of a differential current, the polarity of said differential current for the DFE feed back signal being controlled by the DFE sign control signal.

The receiver circuits described above can be manufactured on a single substrate in bipolar or MOSFET technology, form a part of a semiconductor device, e.g. on a circuit board, and if required, may be manufactured in an electronic package.

BRIEF DESCRIPTION OF THE DRAWINGS

Embodiments of the invention will now be described, by way of example, with reference to the accompanying drawings in which:

FIG. 8 is a functional block diagram of the data recovery 112 of FIG. 2;

FIG. 9 shows three eye diagrams, exhibiting the effect of pulse width distortion;

FIG. 10 shows a shifted differential waveform and a corresponding eye diagram;

FIG. 12 is a circuit diagram of the comparator 300 and adder stage 302 of FIG. 8;

FIG. 13 is a diagram of the slicing level control circuit 108 of FIG. 2;

FIG. 14 is a diagram of the Decision Feedback Equalizer (DFE) circuit 114 of FIG. 2;

FIG. 15 is an expanded functional block diagram showing a phase adjustable Clock Recovery circuit, combining the Clock Recovery 110 with the Phase Offset Control 104 of FIG. 2;

FIG. 16 is a circuit diagram of the charge pump 404 of FIG. 15;

FIG. 17 is a circuit diagram of the Phase Offset Control 104 of FIG. 2 and FIG. 15;

FIG. 18 is an XY chart of the Linear Phase Detector Characteristic of the PFD 402 of FIG. 15; and FIG. 19 is a timing diagram illustrating the sampling edge with and without applied phase offset, corresponding to the XY chart of FIG. 18.

DETAILED DESCRIPTION OF THE EMBODIMENT OF THE INVENTION

Figure 2:
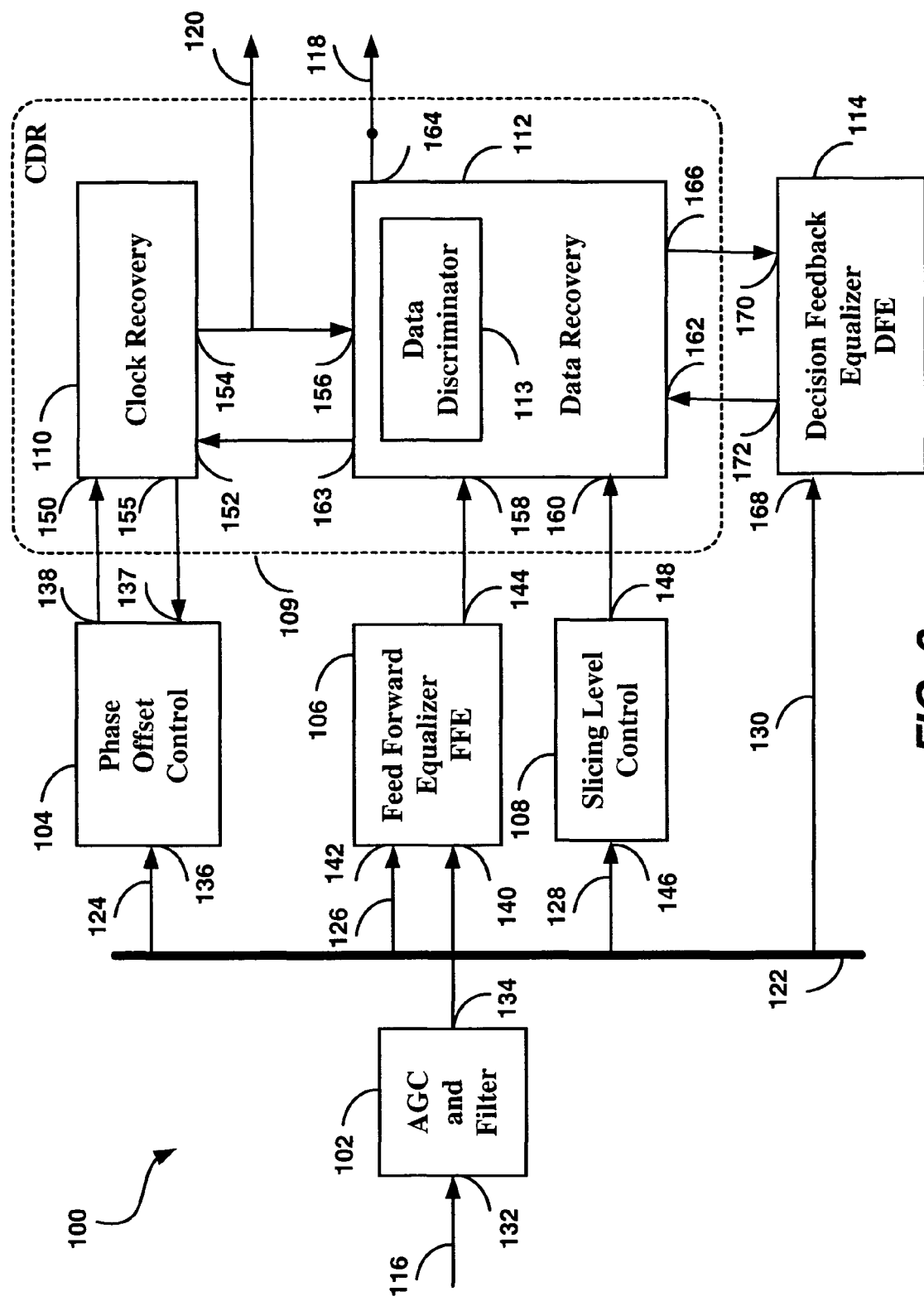
FIG. 2 is a system level block diagram of the embodiment of the invention.

The embodiment of the invention is illustrated in FIG. 2 in the form of a system level block diagram. Each of the blocks of FIG. 2 is first briefly explained in terms of the system level functionality, and subsequently explained in more detail, with the aid of additional drawings.

Illustrated in FIG. 2 is the embodiment of an improved receiver circuit with electronic dispersion compensation (receiver circuit) 100, comprising an AGC and Filter block 102; a Phase Offset Control block 104; a Feed Forward Equalizer (FFE) 106; a Slicing Level Control block 108; a Clock and Data Recovery circuit (CDR) 109, comprised of a Clock Recovery block 110; a Data Recovery block 112; and a Decision Feedback Equalizer (DFE) 114.

Figure 1:
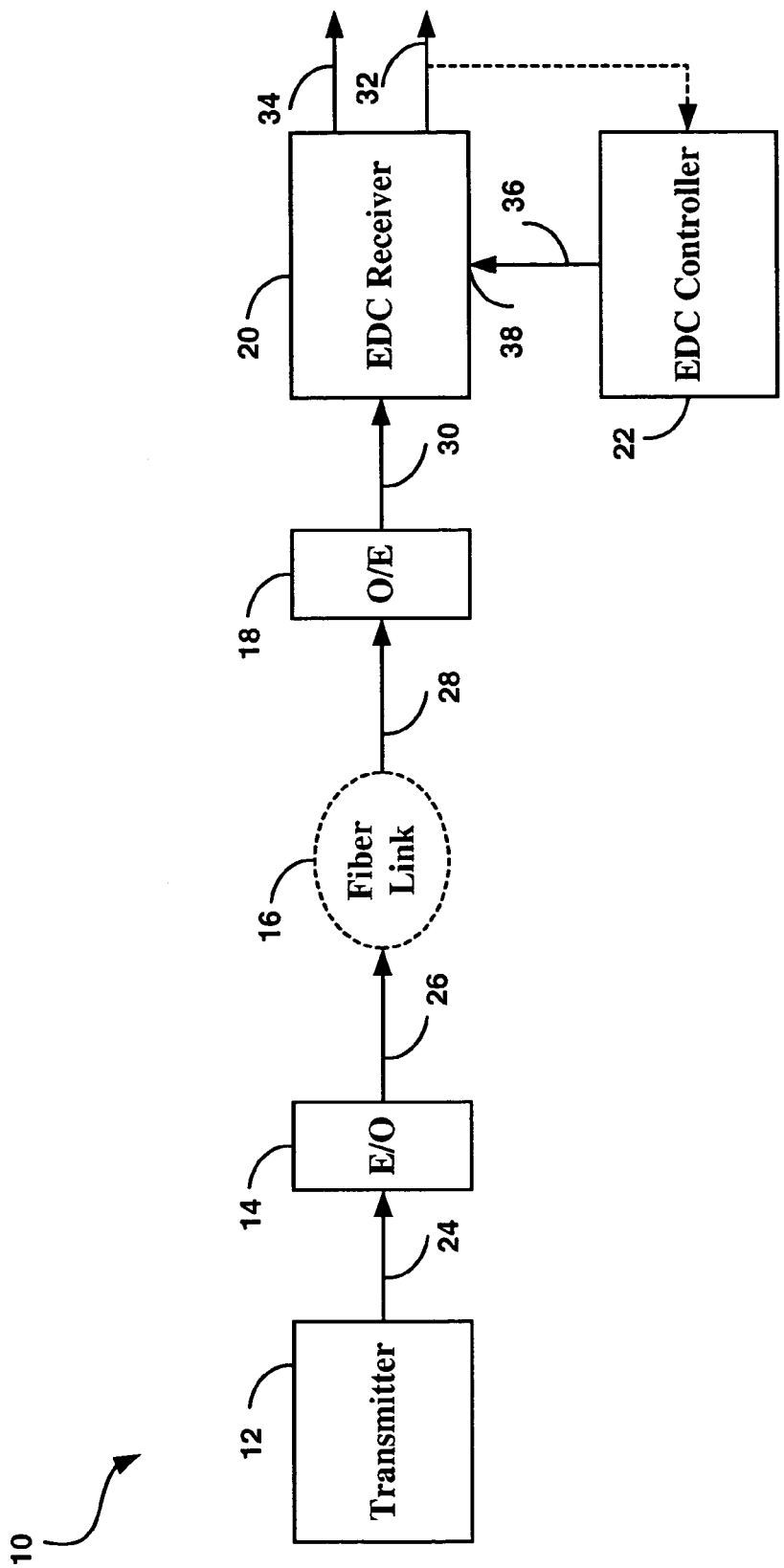
FIG. 1 illustrates a typical fiber optic communications system with electronic dispersion compensation of the prior art.

The receiver circuit 100 is intended to be used in a fiber optic communications system, in place of the EDC receiver 20 of FIG. 1, with improvements due to the design of the receiver circuit 100 providing better dispersion compensation (resulting in longer reach, better signal to noise ratio, or both), and allowing higher transmission speed.

The receiver circuit 100 receives a number of differential analog signals and generates differential digital signals. All signals interconnecting the blocks 102–114 of the receiver circuit 100 are differential signals. The adjective "differential" is thus implied for all signals in the receiver circuit 100 shown in FIG. 2, and will be omitted for brevity in the further description.

The receiver circuit 100 receives an analog input signal 116 from an opto/electrical receive circuit (not shown), the analog input signal 116 representing in electrical form an optical signal received from an optical fiber link. The receiver circuit 100 outputs a digital retimed data signal 118 and a recovered clock 120. The receiver circuit 100 further receives a number of (differential) analog control signals 122. The analog control signals 122 are derived from a number of digital-to-analog converters (DAC) not shown, and are divided into 4 groups namely; a Phase Offset Control signal 124; a set of "n" (n>1) tap weights 126; a Slicing Level Control signal 128; and a DFE weight 130.

To facilitate the further description, including the detailed descriptions of the individual blocks 102–114, each of the blocks inputs and outputs will be given distinct reference numerals as follows.

The AGC and Filter block 102 has an analog input 132 and an analog output 134.

The Phase Offset Control block 104 has a Phase Offset Control input 136, a Phase Offset Enable input 137, and an offset current output 138.

The Feed Forward Equalizer (FFE) 106 has an analog data input 140, a tap weights input 142 comprising "n" (n>1) tap weights, and an equalized data output 144.

The Slicing Level Control block 108 has a Slicing Level Control input 146 and a slicing level output 148.

The Clock Recovery block 110 has an offset input 150, a raw data input 152, and a recovered clock output 154, as well as a Phase Offset Enable output 155.

The Data Recovery 112, comprising a Data Discriminator 113, has a clock input 156, an analog data input 158, a slicing level input 160, and a decision feedback input 162. The Data Recovery 112 further has a raw data output 163, a retimed data output 164 and a DFE sign control output 166.

The Decision Feedback Equalizer (DFE) 114 has a DFE weight input 168, a DFE sign control input 170, and a DFE feedback output 172.

The analog input signal 116 of the receiver circuit 100 is connected to the analog input 132 of the AGC and Filter block 102. The output of the AGC and Filter block 102 is connected to the analog data input 140 of the FFE 106, the equalized data output 144 of which is connected to the analog data input 158 of the Data Recovery 112. The digital retimed data signal 118 is generated at the retimed data output 164 of the Data Recovery 112, while the recovered clock signal 120 is generated at the recovered clock output 154 of the Clock Recovery 110.

The analog control signals 122 are connected to the correspondingly named inputs of the blocks 104–108 and 114 as follows:

The Phase Offset Control signal 124 is connected to the Phase Offset Control input 136 of the Phase Offset Control block 104; the set of "n" (n>1) tap weights 126 is connected to the tap weights input 142 comprising "n" (n>1) tap weights of the FFE 106; the Slicing Level Control signal 128 is connected to the Slicing Level Control input 146 of the Slicing Level Control block 108; and the DFE weight 130 is connected to the DFE weight input 168 of the DFE 114.

Not shown in FIG. 2 are test and test control signals which are not required for the proper operation of the receiver circuit 100 in its normal application, but which may be provided to facilitate the testing of the individual blocks of the receiver circuit 100 during manufacture.

Each of the blocks, reference number 102–114, in FIG. 2 will be described in more detail as necessary below, after the functional overview.

Functional Overview (FIG. 2)

The signal 116 received at the input 132 of the AGC and Filter 102 is distorted, and may range in level over some range, and may have a wider bandwidth than necessary. The AGC and Filter 102 increases the signal power and reduces the dynamic range of the received signal, and passes the signal through a low pass filter to limit the bandwidth of the signal at the output 134 of the AGC and Filter 102 to an optimum value for maximum signal to noise ratio. The AGC and Filter 102 of the embodiment of the invention is a conventional differential circuit, hence the input 132 and the output 134 are differential. It needs no further description.

The feed forward equalizer (FFE) 106 is a finite impulse response (FIR) filter with adjustable tap weights and is used to reduce part of the signal degradation that is due to dispersion. Briefly, the filtering operation corresponds to scaling the different delayed samples by the filter coefficients applied to the FFE 106 through its tap weights input 126 (i.e. the adjustable tap weights) and then summing them up. The length of the FFE, that is the number "n" of required taps, and the tap spacing depends on the expected pulse broadening introduced by the transmission channel which includes the optical fiber channel. The FFE 106 receives a (dispersion) distorted analog signal from the AGC and Filter 102, and generates an equalized analog data signal (dispersion compensated signal).

The analog signal (the dispersion compensated signal) from the output 144 of the FFE 106 is applied to the analog data input 158 of the Data Recovery 112. The Data Recovery 112 converts the analog signal at the analog data input 158 into a raw digital signal at the raw data output 163 and into the retimed data signal 118 at the output 164, having retimed it with the recovered clock 120 which is generated by the Clock Recovery 110, and coupled from the recovered clock output 154 of the Clock Recovery 110 to the clock input 156 of the Data Recovery 112. The Clock Recovery 110 uses the raw digital signal coupled from the raw data output 163 of the Data Recovery 112 to the raw data input 152 of the Clock Recovery 110.

It is a generally accepted usage in clock and data recovery (CDR), that an analog waveform is converted into a digital signal by (a) slicing the analog signal at a slicing point (voltage level) half way between its minimum and its maximum amplitude (or 0 Volts differential in the case of a differential signal), to obtain a raw digital signal;

(b) deriving a clock from the raw digital signal using a form of phase locked loop (PLL); and (c) sampling (retiming) the raw digital signal at a "mid point" between assumed bit transitions.

In practice, especially in high speed systems, the optimum sampling point may not lie at the precise "mid point", nor may the optimum slicing level be precisely at the halfway level (or 0 Volts differential in the case of a differential signal).

The Phase Offset Control block (circuit) 104 of the embodiment of the invention permits the clock sampling point to be adjusted, under control of the Phase Offset Control signal 124 applied at the input of the Phase Offset Control 104. The Phase Offset Control 104 converts this control signal into a form (a differential offset current at its output 138) that is suitable for shifting the sampling point of the Clock Recovery 110, to the input 150 of which it is coupled. The Phase Offset Enable input 137 receives an enable signal from the Phase Offset Enable output 155 of the Clock Recovery 110 which controls the timing of the Phase Offset Control 104 in a manner as will be described in more detail below.

The Slicing Level Control 108 of the embodiment of the invention permits the slicing level to be shifted to compensate for any DC offsets in the analog signal and photodetector characteristic. The external Slicing Level Control signal 128 is applied at the input of the Slicing Level Control 108. The Slicing Level Control 108 converts this control signal into a form (at its output 148) that is suitable for shifting the slicing level of the Data Recovery 112, to the input 160 of which it is coupled, by adding a static offset to the equalized analog data signal.

The actual slicing level of the Data Recovery 112 is further modified (shifted up or down) by a fast varying signal to compensate for transmission channel memory generated by the Decision Feedback Equalizer (DFE) 114. In the prior art, for example the article to A. Gandhi and S. Behtash cited above in the background section, a DFE may also be a filter (FIR) of a certain length M having the previous M decisions as its inputs, and a corresponding set of M tap weights. In the DFE circuit 114 of the invention, there is only one tap (M=1), and only the single DFE weight 130 is coupled to the DFE weight input 168 of the DFE 114. The DFE 114 receives at its DFE sign control input 170 a digital signal representing the previous decision from the DFE sign control output 166 of the Data Recovery 112. The DFE feedback output 172 of the DFE 114 is applied to the DFE feedback input 162 of the Data Recovery 112, where it is subtracted as a dynamic offset from the equalized analog data signal. As noted below, subtraction is effected by addition after reversing the leads of the (differential) DFE feedback signal.

Figure 3:
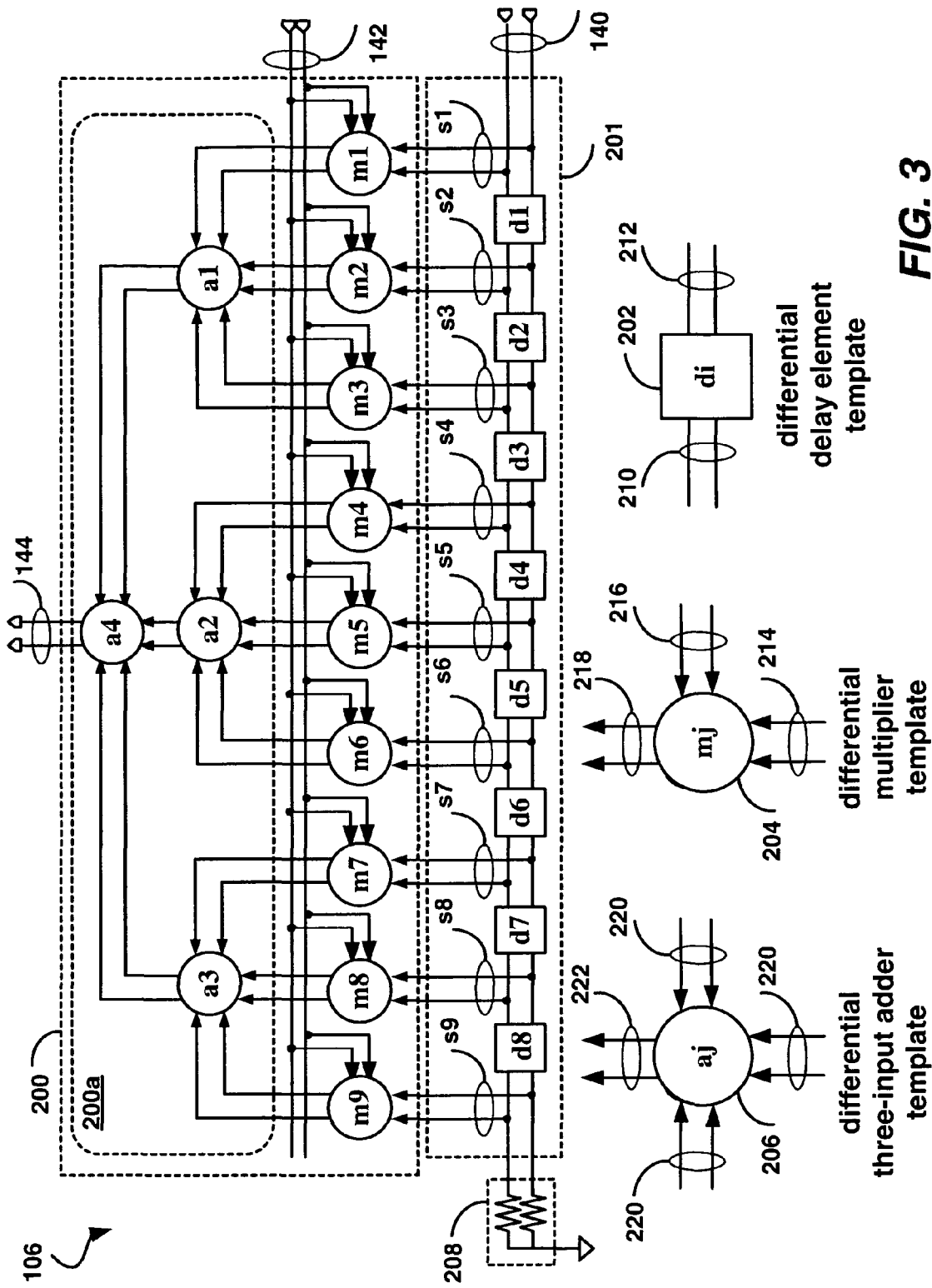
FIG. 3 shows an implementation of the Feed Forward Equalizer (FFE) of FIG. 2.

Feed Forward Equalizer 106 (FIG. 3)

An exemplary implementation of the Feed Forward Equalizer (FFE) 106 of the embodiment of the invention is shown in more detail in the block diagram of FIG. 3. Elements of the implementation are then further expanded in FIGS. 4, 5, and 6. A preferred physical layout of elements making up the FFE of FIG. 3 is illustrated in FIG. 7.

The FFE 106, having "n" taps (n=9), comprises a grouping of active elements 200 (including a summing tree 200a) and a differential tapped delay line 201 comprising 8 differential delay elements 202 labeled d1 to d8. The grouping of active elements 200 comprises 9 differential analog multipliers 204 labeled m1 to m9 and the summing tree comprising 4 differential three-input adders (differential analog adders) 206 labeled a1 to a4 forming a balanced two-layer summing tree. To terminate the differential tapped delay line 201, the FFE 106 also includes a termination resistor pair 208. As indicated earlier, all input and output signals of the FFE 106 are differential, and the FFE 106 consequently contains differential circuits, including the active elements 200 and the differential tapped delay line 201. The FFE 106 being entirely composed of differential analog circuits may be referred to as a differential analog Feed Forward Equalizer (FFE).

Each of the major types of circuits (202, 204, and 206) used in the FFE is also illustrated by a logic symbol template, with reference numerals for their inputs and outputs shown only in the template illustrations. All inputs and outputs being differential, there exists always a "positive" and a "negative" terminal. A single reference numeral is given to a differential signal, it being understood that interconnections are always between the respective "positive" and "negative" terminals unless otherwise noted. Where a distinction is to be made between the "positive" and "negative" terminals of an input, an output, or a signal, the suffix "p" or "n" will be used, e.g. 118p and 118n would be used to designate the individual terminals of the digital retimed data signal 118.

The differential terminals of the differential delay element (template) 202 are labeled 210 and 212; the differential delay element of the embodiment of the invention being a passive device, either terminal may be designated an input the other terminal then becoming the output.

The inputs of the differential analog multiplier (template) 204 are a signal input 214 and a tap weight input 216. The differential analog multiplier 204 has a single output 218.

The three equivalent inputs of the differential three-input adder (template) 206 are signal inputs 220. The adder has a single output 222.

The 8 differential delay elements 202 $d_i$ are passive circuits, interconnected in series, to form the differential tapped delay line 201: the analog data input 140 of the FFE 106 is connected to the input of the first differential delay element d1, i.e. the delay line input of the differential tapped delay line 201. The input of each subsequent differential delay element $d_i$ (i=2 to 8) is connected to the output of the previous differential delay element $d_{i-1}$. The output of the last differential delay element d8 is connected to the termination resistor pair 208. The differential tapped delay line 201 may also be described as a transmission line comprised of a number of segments, each segment being realized as a delay element 202.

Nine (differential) output taps of the differential tapped delay line are labeled s1 to s9, taps s1 to s8 being at the inputs of the delay elements d1 to d8, and s9 being at the output of the last delay element d8. Each of the taps s1 to s9 is connected to the signal input 214 of the differential analog multipliers m1 to m9, in order. The tap weight inputs 216 of each of the differential analog multipliers m1 to m9 is connected to a corresponding one of the set of "n" (n=9) tap weights input 142.

The outputs 218 of the differential analog multipliers m1 to m9 are connected in groups of three, to the inputs 220 of differential three-input adders $a_j$, where $j=\lfloor(i-1)/3\rfloor+1$, i.e. i=1 to 9 j=1 to 3, and the outputs 218 of m1, m2, and m3 are connected to the inputs 220 of a1; the outputs 218 of m4, m5, and m6 are connected to the inputs 220 of a2; and the outputs 218 of m7, m8, and m9 are connected to the inputs 220 of a3.

The differential outputs 222 of each of the three differential three-input adders $a_j$ (j=1 to 3) are connected to the inputs 220 of the fourth differential three-input adder a4, the differential output 222 of the adder a4 being the final output 144 of the FFE 106.

The three-input adders are conveniently used to build a 2-stage hierarchy of adders for adding n=9 values together, the values being provided by the outputs of the nine differential analog multipliers. Similar hierarchical configurations may be constructed for other values of "n", using three-input adders, or adders with a different number of inputs, as required, and using a 2-stage, a 3-stage hierarchy of adders as may be required.

In order to achieve the high speed at which the FFE 106 can operate (the goal is to support data rates of 10 Gb/s or more), it is important to ensure that the propagation paths from each tap s1 to s9 of the differential tapped delay line 201 to the final circuit output 144 of the FFE 106 be of equal electrical and physical length.

With this goal in mind, the FFE 106 is designed with a balanced and symmetrical circuit topology, including the hierarchical structure of the adders. This includes the design of a balanced summing tree arranged so that each multiplied signal passes through the same number of adders before reaching the output of the FFE. This is achieved with a summing tree that is based on two layers of adders, each adder having "a" adder inputs, wherein $a \approx \sqrt{n}$, and "a" and "n" are integers (a=3 and n=9 in the present embodiment).

The operation of the FFE 106, being a form of a finite Impulse response (FIR) filter, is briefly described, without initially taking into account important secondary effects caused by the limited bandwidth of the circuit elements themselves.

The differential analog input signal from the input 140 of the FFE 106 is propagated through the differential tapped delay line 201 and terminated in the termination resistor pair 208. Thus at any moment in time, the taps $s_i$ (i=1 to 9) carry the signal from the input signal of 140, delayed by (i−1)·D, where D is the delay constant of each differential delay element 202. The signal at each tap $s_i$ is then multiplied by a tap weight constant $w_i$ (from the tap weights input 142), and the resulting products summed to provide the FIR filter output 144. The delay constant D and the values of the tap weight constants $w_i$ determine the characteristics of the FIR filter, and thus the FFE 106. The purpose of the FFE 106 is to compensate for impairments introduced by the fiber link. The actual values of the tap weight constants $w_i$ may be provided by an EDC controller 22 (FIG. 1).

Because of the high data rates of 10 Gb/s or more, the characteristics of the FFE 106 are not only determined by the delay D and the tap weight constants $w_i$, but also the frequency and phase characteristics of the circuit elements 202 (delay element), 204 (multiplier), and 206 (adder) themselves. To achieve optimal performance, the design of these elements themselves, and their physical realization must be considered very carefully.

Figure 4:
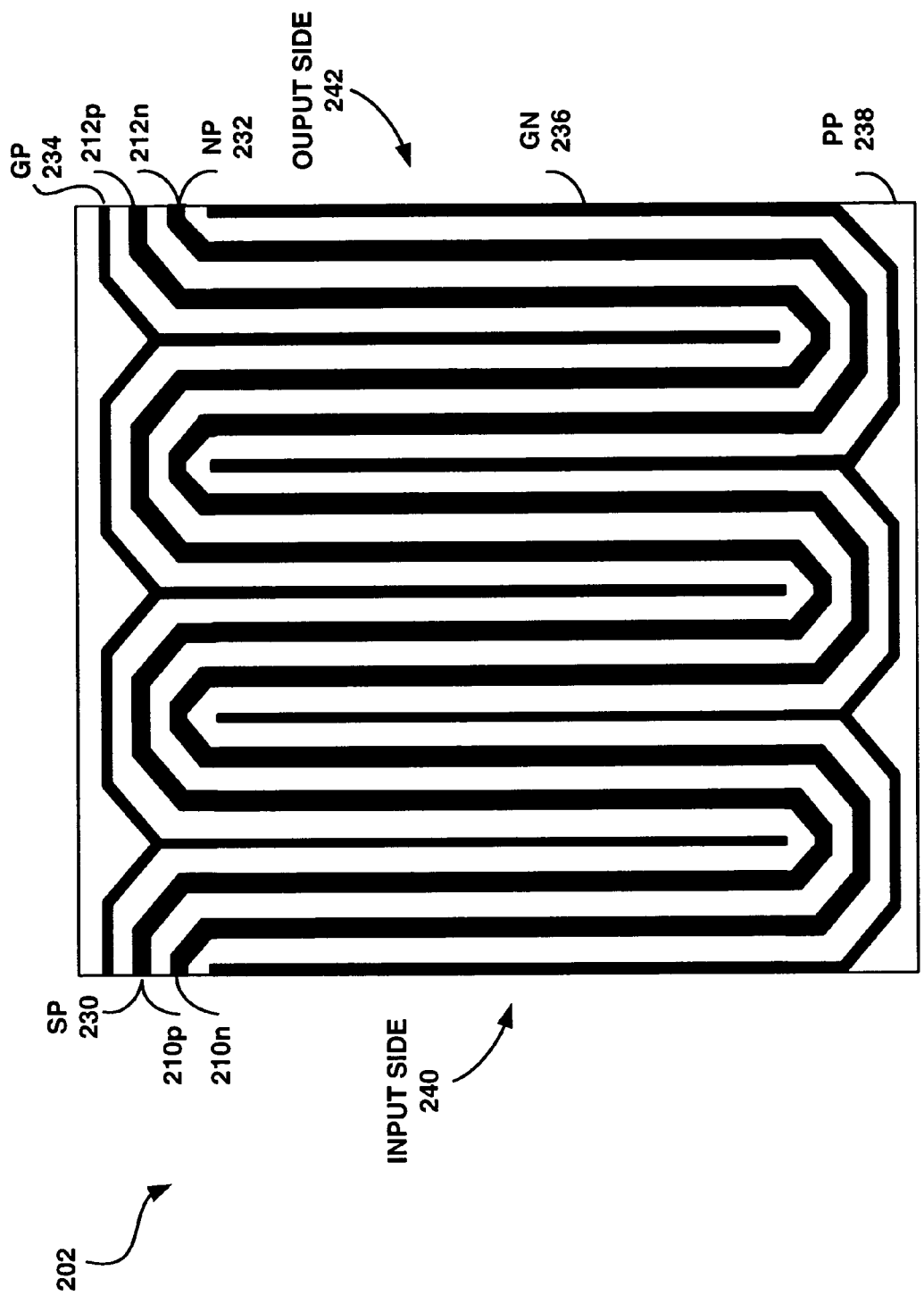
FIG. 4 shows the design of the differential delay element of the FFE of FIG. 3.

Differential Delay Element 202 (FIG. 4)

One of the principal impediments to the realization of a purely analog feed forward equalizer (FFE) is the provision of sufficiently wide bandwidth delay structures. For circuits operated at data rates of 10 Gb/s or more, and having in excess of 5 taps, the insertion loss, the reduction in bandwidth and the group delay variation from the first to the last tap can significantly impair the performance of the equalizer. To minimize this impairment, the delay structures in the present invention are implemented as transmission lines. Compared to transistor or filter based implementations, this approach provides high bandwidth, zero power dissipation, low group delay variation and less susceptibility to variations in component tolerances and temperature.

The design of an embodiment of the differential delay element 202 is illustrated in detail in FIG. 4, showing a sketch of a physical realization of such a delay element, suitable for depositing as metal patterns on a substrate, such as a silicon substrate, that supports at least two metal layers. Such substrates are commonly used in the manufacture of silicon integrated circuits, the aim being that the differential delay element 202 may be manufactured along with the other circuits of the EDC Receiver 20 on the same substrate.

FIG. 4 shows a short transmission line (a segment), capable of being concatenated to form a longer transmission line of a number of segments, each segment then being used as a differential delay element 202 in the context of the FFE 106.

The differential delay element 202 includes four separate metal strips, a positive signal layer SP 230, a negative signal layer SN 232, grounded posts GP 234 and GN 236, all four metal strips being deposited on the substrate in a first single metallization layer, and a ground plane PP 238 deposited on the substrate in a second metallization layer.

Preferably, the first single metallization layer is the metallization layer providing the thickest metal of the substrate accommodating the FFE circuit (typically the top metallization layer of the substrate), and the second metallization layer is the layer below the top layer. The first and second metallization layers are separated by a non-conducting insulating layer.

The differential transmission line is formed by the positive signal layer SP 230, and the negative signal layer SN 232 which meander side by side from the top of the input side 240 to the top of the output side 242.

To simplify the description, let us use the terms North (N), East (E), South (S), and West (W), to identify directions, the input side 240 being at the Western end of the structure.

The positive signal layer SP 230 starts at the input side 240 in horizontal direction, i.e. going East, then turns, making two 45 degree turns, into a Southward direction. Near the bottom of the structure, it turns again, through two 45 degree turns, to go East, then immediately makes another two 45 degree turns to go North. Near the top of the structure, the positive signal layer SP 230 makes another two 45 degree turns to go East again. From this point on, the folding pattern (East-South-East-North-East) repeats two more times, until the positive signal layer SP 230 reaches the output side 242, near the top of the structure.

The negative signal layer SN 232 starts a short distance "d", "d" being the distance between the signal layers SP 230 and SN 232, to the South of the positive signal layer SP 230, and follows the same turns along the positive signal layer SP 230, keeping substantially at the same distance d, until it emerges also at the output side 242, a distance of d to the South of the positive signal layer SP 230.

Parallel to the positive signal layer SP 230 to the North, and extending into the folds of the positive signal layer SP 230, is placed the positive grounded post GP 234. Similarly, parallel to the negative signal layer SN 232 to the South, and extending into the folds of the negative signal layer SN 232, is placed the negative grounded post GN 236. The grounded posts GP 234 and GN 236 extend along side the respective signal layers SP 230 and SN 232, conveniently at substantially the same constant distance "d" that separates the signal layers from each other.

In the second metallization layer, underlying the entire structure of the folding signal layers SP 230 and SN 232, and of the grounded posts GP 234 and GN 236, extends the ground plane PP 238. The signal layers SP 230 and SN 232 are insulated from each other and from the grounded posts GP 234 and GN 236, and from the ground plane PP 238. The grounded posts GP 234 and GN 236 are connected by vias (conducting paths through the insulating layer) to the ground plane PP 238.

The differential delay element 202 is used as a circuit element in the FFE 106 (FIG. 3), where the differential inputs 210 correspond to the terminals 210*p* and 210*n* in FIG. 4, and the differential outputs 212 correspond to the terminals 212*p* and 212*n* in FIG. 4.

Figure 5:
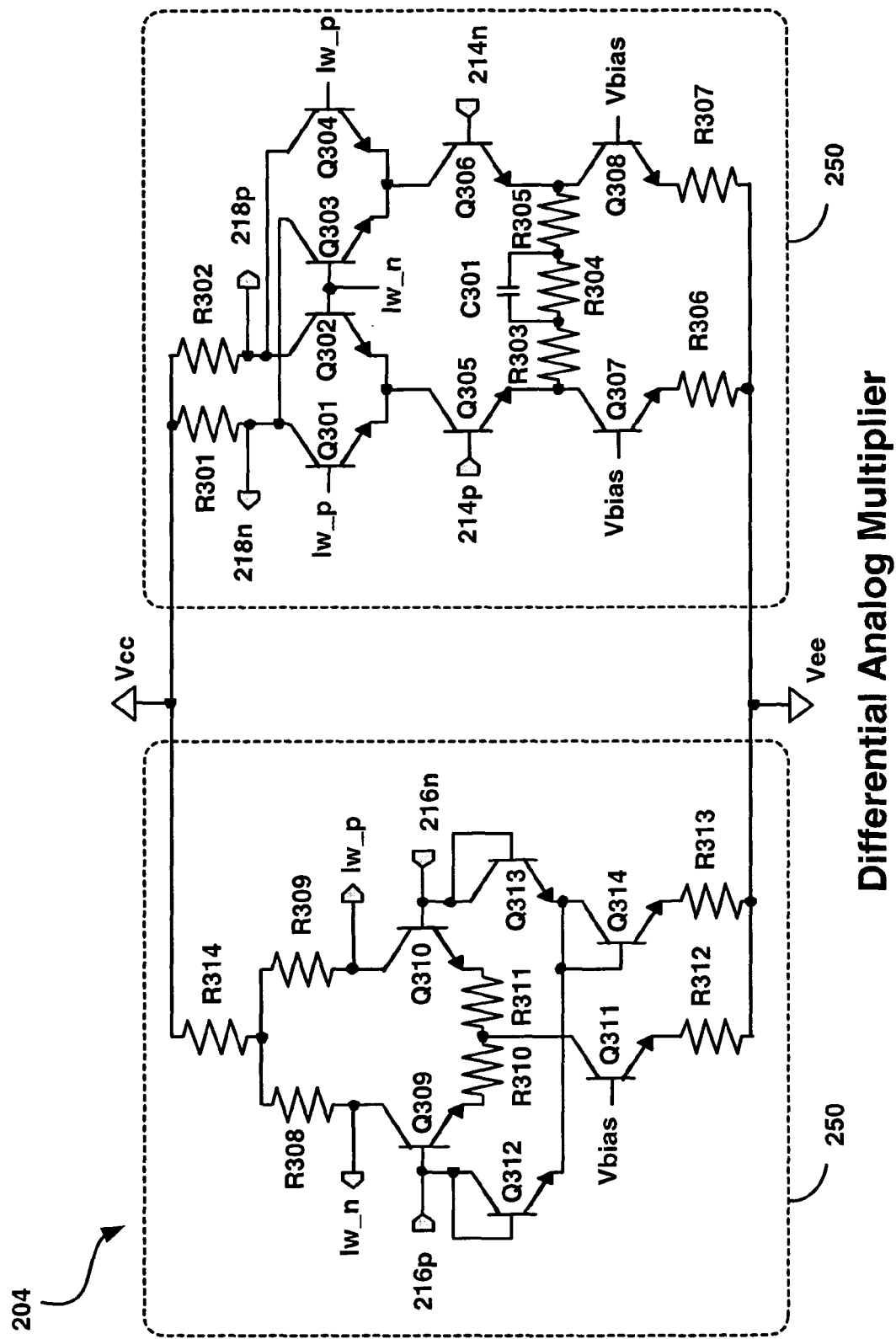
FIG. 5 is a circuit diagram of the differential multiplier element of the FFE of FIG. 3.

Differential Analog Multiplier 204 (FIG. 5)

FIG. 5 is a circuit diagram of the differential analog multipliers 204. The circuit is based on the conventional translinear or analog multiplier topology, see e.g. D. Johns, K. Martin, "Analog Integrated Circuit Design", John Wiley and Sons, Inc., 1997.

The circuit of the differential analog multipliers 204 includes 14 bipolar devices (transistors) Q301 to Q314; 14 resistors R301 to R314; and a capacitor C301. It is connected to supply voltages Vee, Vcc, and Vbias; accepts the differential inputs 214 (terminals 214*p* and 214*n*) and 216 (terminals 216*p* and 216*n*); and generates the differential output 218 (terminals 218*p* and 218*n*). The implementation of the differential analog multiplier is divided into two separate sections: a linear to logarithmic converter section 250 which accepts the external input 216 and generates intermediate signals 1w_n and 1w_p, and an adder and logarithmic to linear converter section 252 which accepts the intermediate signals 1w_n and 1w_p, and the external input 214 to generate the external output 218.

Linear to Logarithmic Converter Section 250 (FIG. 5)

The transistors Q312 and Q313 are used as diodes (collector and base tied together), and connected to the inputs 216*p* and 216*n* respectively. The emitters of the transistors Q312 and Q313 are connected to another diode (transistor Q314 with collector and base tied together) whose emitter is connected to Vee through the resistor R313.

The inputs 216*p* and 216*n* are further connected to the bases of the transistors Q309 and Q310 respectively. The emitters of the transistors Q309 and Q310 are connected through the resistors R310 and R311 to a current source, that is the collector of the transistor Q311 whose base connects to Vbias, and whose emitter is connected to Vee through the resistor R312.

The collectors of the transistors Q308 and Q309 provide the intermediate signals 1w_n and 1w_p, and are connected to Vcc through a star network of three resistors, R308 (collector of Q309), R309 (collector of Q310) and R314 (Vcc).

Adder and Logarithmic to Linear Converter Section 252 (FIG. 5)

Starting from Vcc and going towards Vee, the circuit contains three stages of transistors in series: collector resistors R301 and R302 provide load between Vcc and the collectors of Q301 and Q303 (R301), and Q302 and Q304 (R302) respectively. The bases of the transistors Q301 and Q304 are jointly connected to the intermediate signal 1w_p. Similarly, the bases of the transistors Q302 and Q303 are jointly connected to the intermediate signal 1w_n. The emitters of the transistors Q301 and Q302 are jointly connected to the collector of the transistor Q305, and similarly, the emitters of the transistors Q303 and Q304 are jointly connected to the collector of the transistor Q306. The bases of the transistors Q305 and Q306 receive the input signals 214p and 214n respectively. The emitters of the transistors Q305 and Q306 are connected to separate current sources, that is to the collectors of the transistors Q307 and Q308 respectively whose bases connect to Vbias, and whose emitters are connected to Vee through the resistor R306 and R307 respectively. A passive network provides a bridge between the emitters of the transistors Q305 and Q306, the passive network containing the resistors R303 (connected to the emitter of Q305), in series with R304, and R305 (connected to the emitter of Q306), and where the capacitor 301 is connected in parallel with the resistor R304.

Functional Description of the Differential Analog Multiplier 204 (FIG. 5)

In spite of the superior bandwidth and group delay performance afforded by using transmission lines as signal delay elements, a high speed analog FFE will exhibit self-induced distortion. Although tolerable for FFE circuits with a small number of taps, the distortion introduced by the delay structures can become prohibitive when the number is increased beyond five. In the present invention, this matter is lessened by the inclusion of compensatory elements in the design of the multiplier and adder circuits.

The circuit diagram for the differential analog multiplier 204 is shown using a bipolar device technology in FIG. 5 and is based on the conventional translinear or analog multiplier topology as mentioned above. Fundamentally, a translinear gain cell acts as a highly linear current scaler. The translinear analog multiplier is merely a cross-coupling of two such gain cells. The implementation of the differential analog multiplier 204 is divided into two separate sections: linear to logarithmic converter section 250, and adder and logarithmic to linear converter section 252.

The first section (250) takes as its input a pair of complimentary currents, 216p and 216n. These currents are derived from an electronically controlled differential current source and are converted to a differential input voltage by means of identical base-emitter diodes Q312 and Q313. By selecting R308/R309 such that their values are equal to the sum of the emitter resistances of Q309/Q310 and the resistors R310/R311, the differential input voltage is translated directly to the output at 1w_n and 1w_p and subsequently to the input of the second section (252), which consists of two cross-coupled differential gain cells defined by Q301/Q302 and Q303/Q304 respectively. If the base-emitter junction of the diodes of Q312 and Q313 are matched to the base-emitter junctions of the transistors Q301/Q302 and Q303/Q304, then the currents at 218n and 218p will be proportional to the input currents at 216p and 216n. The multiplicative action occurs because the differential input voltage signal at 214p and 214n controls the division of current between the cross-coupled differential gain cells. By inserting emitter resistors R303, R304 and R305 having a sum that is much greater than the emitter resistance of Q305 and Q306, the division of the current will be defined by the ratio of their sum to the sum of the collector resistors R301 and R302. Being inherently linear circuit elements whose values do not vary with the input signal level, the current division defined by the resistors will be proportional to the amplitude of the differential input signal at 214p and 214n. In this way, the multiplier's differential output voltage is a linear function of the product of both the inputs at 216p and 216n, and at 214p and 214n. Since both the differential inputs and outputs can assume positive and negative polarities, the circuit is also referred to as a four-quadrant multiplier.

The translinear multiplier thus described (the differential analog multiplier 204) is a well known circuit topology that is used extensively in communication systems. Although the circuit can have a wide bandwidth with respect to the data rate and can readily accommodate the fixed insertion loss of the delay elements, the conventional design does not provide any compensation for the input bandwidth reduction and group delay variation. The absence of this feature is addressed in the present invention by introducing capacitor C301 in parallel with R304. Since the multiplier's output level is proportional to the ratio of the sum of the collector and emitter resistances, the capacitor will make the emitter resistance appear smaller as the frequency increases. By judicious selection of the values of C301 and R304, the multiplier's complex gain-frequency profile can be made to compensate for some or all of the impairments introduced by the delay elements. If C301 and R304 are selected in the same way for each multiplier in the FFE, the outputs of each one can be made to have a nearly constant gain and group delay response with respect to the overall FFE input in the bandwidth of interest.

Figure 6:
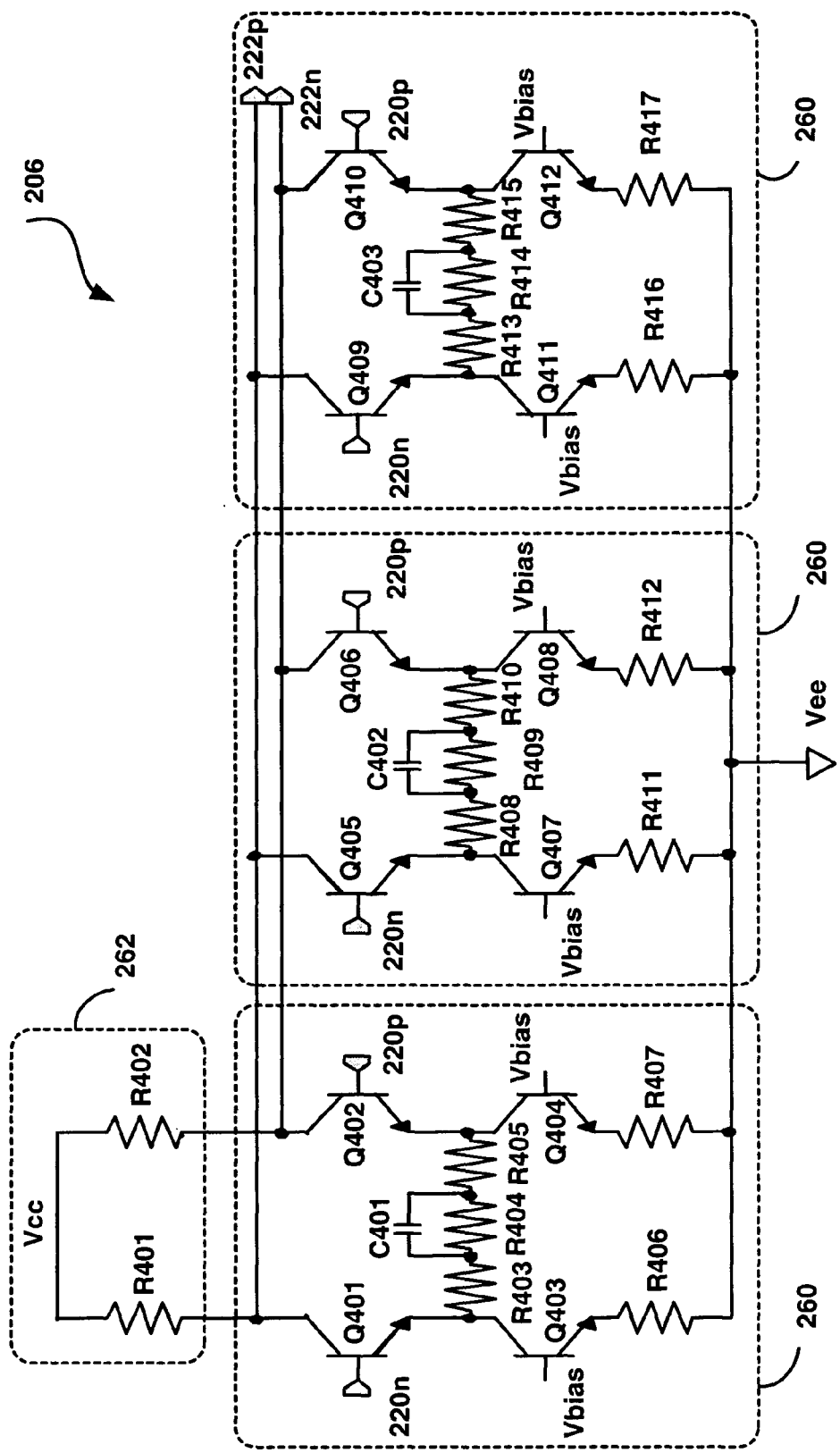
FIG. 6 is a circuit diagram of the differential three-input adder of the FFE of FIG. 3.
Figure 7:
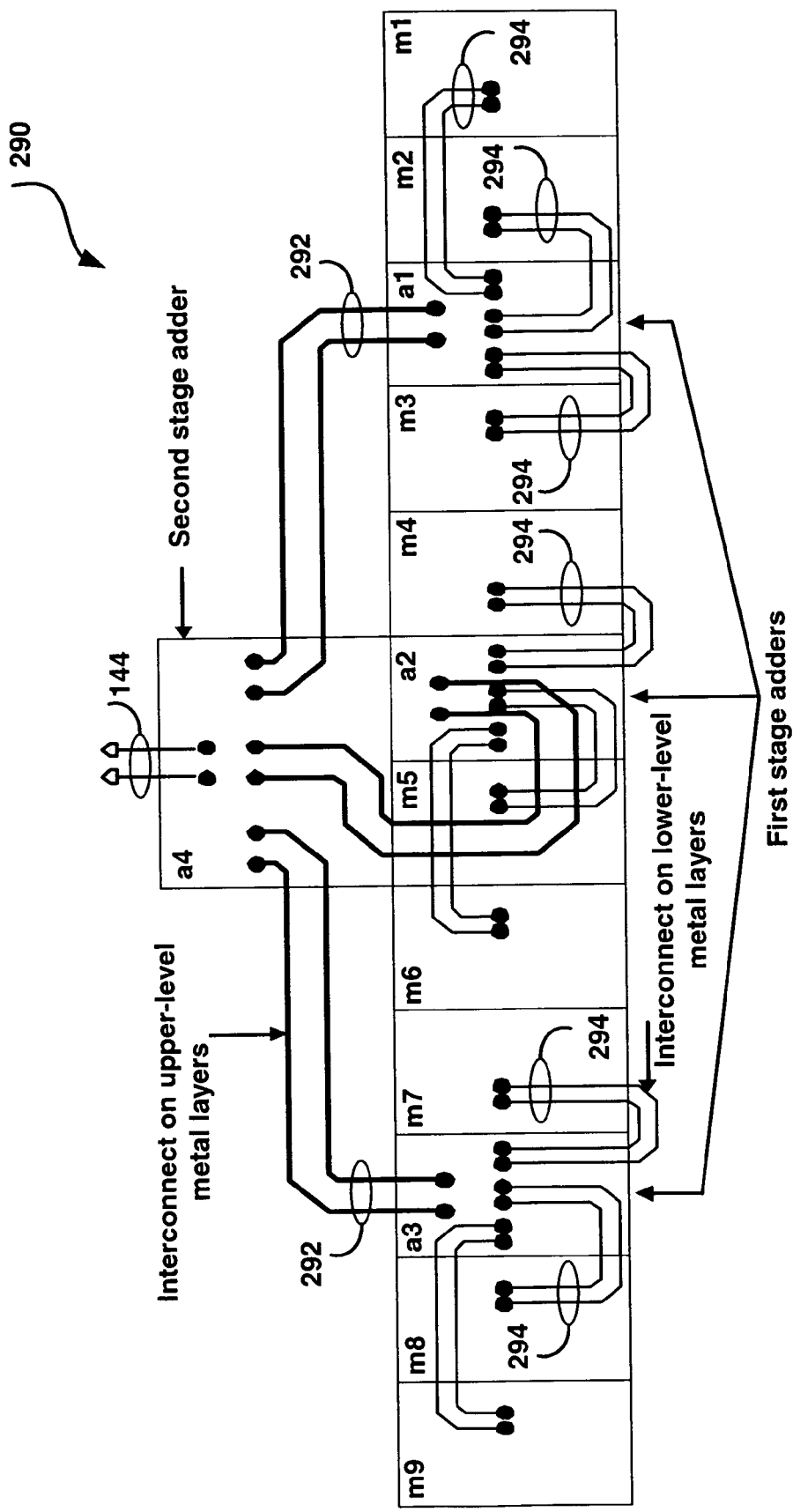
FIG. 7 shows the preferred physical layout of elements making up the FFE of FIG. 3.

Differential Three-input Adder 206 (FIG. 6)

FIG. 6 is a circuit diagram of the differential three-input adder 206. The circuit contains three identical differential amplifier sections 260, and a load resistor section 262. All four sections share the differential output 222 (222p and 222n).

Each differential amplifier section 260 contains four transistors, five resistors, a capacitor, and has a distinct input 220 (220p and 220n). Only one of the three differential amplifier sections 260, comprising transistors Q401 to Q404, resistors R403 to R407, and capacitor C401 is described in detail, the second differential amplifier section having the same structure and comprising transistors Q405 to Q408, resistors R408 to R412, and capacitor C402. The third differential amplifier section also has the same structure and comprises transistors Q409 to Q412, resistors R413 to R417, and capacitor C403.

The load resistor section comprises two resistors R401 and R402, connected between the outputs 222n and 222p respectively, and the supply voltage Vcc.

Turning to the first (representative) differential amplifier section 260, the collectors of the transistors Q401 and Q402 are connected to the outputs 222n and 222p respectively. The bases of the transistors Q401 and Q402 receive the input signals 220n and 220p respectively. The emitters of the transistors Q401 and Q402 are connected to separate current sources, that is to the collectors of the transistors Q403 and Q404 respectively whose bases connect to Vbias, and whose emitters are connected to Vee through the resistor R406 and R407 respectively. A passive network provides a bridge between the emitters of the transistors Q401 and Q402, the passive network containing the resistors R403 (connected to the emitter of Q401), in series with R404, and R405 (connected to the emitter of Q402), and where the capacitor 401 is connected in parallel with the resistor R404.

The function of each amplifier section 260 of the differential three-input adder 206 is to convert the differential input signal 220 (220$p$ and 220$n$), a voltage, into a proportional differential collector current. The parallel connection of the three amplifier sections 260 results in the differential collector currents from all three sections to be added. Passing the summed differential current into the common load resistor section 262, results in the conversion from current back to voltage, thus generating at the differential output 222 the sum of the differential input voltages of all three inputs 220, scaled according to the choice of resistor values.

Balancing of Electrical Paths in the FFE 106 (FIG. 3)

The FFE 106 of the embodiment of the invention incorporates a number of innovative concepts that are briefly summarized here.

The theory of FIR filters (summing of weighted delayed samples of a signal) on which the FFE 106 is based, is well understood, and generally assumes mathematically ideal components. In constructing an FIR filter to operate at extremely high data rates, i.e. near the limits of the components, their non-ideal behavior (bandwidth limits close to the operating frequency range), as well as the impact of the interconnections (delay) must be taken into account.

The FFE 106 has been designed to provide balancing of the electrical paths that lead from the circuit input 140 to the circuit output 144. It is appreciated that portions of the input signal may travel (and be processed along the way) through 9 different paths, corresponding to the 9 taps s1 to s9 of the differential tapped delay line 201. For example, there is a path from the input 140 equal s1 through m1, a1, and a4. A different, and much longer path is from the input 140 through the 9 delay elements d1–d8, to tap s9 and thence through m9, a3, and a4.

We note that regardless of the path selected, the same number of multipliers 204 (one) and adders 206 (two) are traversed. What varies is the number of delay elements 202. The delay elements 202 being formed by passive transmission line sections, their bandwidth is as high as possible; nevertheless, the cumulative effect of a number of delay elements 202 in series results in a gradual reduction in bandwidth towards the last tap (s9).

The compensation elements (implementing means for partly or substantially compensating the diminishing signal bandwidth) in the multipliers m1 to m9 and the adders a1 to a4 are adjusted to compensate the input (140) to output (144) bandwidth to be balanced (to be substantially the same) for each of the nine signal paths. Conveniently, the multipliers comprise the means for partly or substantially compensating the diminishing signal bandwidth, and the adders comprise the means for substantially compensating the diminishing signal bandwidth, which remains after bandwidth compensation provided by the multipliers.

Depending on the number of taps, the required delay per tap, and the characteristics of the delay elements themselves, it may or may not be possible to implement all of the compensation in the multipliers. This is particularly true for the multipliers for which the input delay is largest and consequently the impairments are at their worst. As a result, it may be necessary to shift some of the compensation burden from the multipliers 204 to the adder circuits 206. Provided that none of the input transistors Q401, Q402, Q405, Q406, Q409 and Q410 are fully switched, each differential pair will behave like a fully independent linear amplifier with its voltage gain defined by the ratio of the sum of the collector resistances to the sum of its own emitter resistances. Likewise, the gain profile for each one can be modified by adjusting its emitter resistor (R404/R409/R414) and capacitor values (C401/C402/C403). Introducing compensation into both adders and multipliers provides enhanced flexibility when fine-tuning the overall performance of the FFE 106. By distributing the compensation elements among more blocks in the circuit, it also helps to keep their parameter values within realizable levels.

Physical Layout 290 of the Active Elements 200 of FFE 106 (FIG. 7)

When implementing the analog FFE, it is important to ensure that the propagation paths from each tap input to the overall circuit output is of equal electrical and physical length. In other words, the physical layout of the FFE circuit should be arranged so that the propagation delay from each of the "n" output taps of the delay line to the FFE circuit output is substantially the same.

At data rates of 10 Gb/s or more, any mismatch in the relative lengths of the interconnections between the multiplier and adder blocks can introduce errors in the complex gain response. Such deficiencies limit the performance of the circuit because they must be accommodated by the adaptation algorithm in addition to the fiber impairments.

To mitigate the problem of mismatched interconnection length, a symmetrical distributed circuit topology is an essential aspect of the present invention. This is realized in the nine-tap FFE 106 shown in FIG. 3, where the addition function is divided into multiple stages, forming a 2-stage hierarchy. That is, the multiplier outputs are combined by three separate adders in the first stage and one in the second. The choice of a 2-stage adder hierarchy also serves to lower the amount of parasitic capacitance present at the outputs of the adders because the division into multiple stages reduces the number of differential pairs that are connected to them, compared to a single stage adder with nine inputs (an adder circuit similar to that shown in FIG. 6, but containing nine amplifier sections 260 instead of three. Consequently, the overall bandwidth of a multi-stage adder is greater than its single-stage equivalent.

An exemplary physical layout 290 of the active elements 200 is illustrated in FIG. 7 which shows the placement of the differential analog multipliers 204 (m1 to m9) and the differential three-input adders 206 (a1 to a4).

The layout 290 includes a row of substantially equal sized cells containing, from right to left, the circuits of m1, m2, a1, m3, m4, a2, m5, m6, m7, a3, m8, and m9. The of a4 is located adjacent to and above the cells of a2 and m5.

By distributing the adders in this way, the balanced propagation and the symmetry of the propagation paths can be addressed at each level of the hierarchy, thus simplifying the problem.

Also shown in FIG. 7 are the balanced differential interconnections (interconnecting tracks) 292 between the multipliers m1 to m9 and the adders a1 to a3, and the balanced differential interconnections 294 between the adders a1 to a3 and a4. Not all interconnections are labeled with reference numerals for clarity.

The output 144 of the final adder stage (a4) in the layout 290 of FIG. 7 corresponds to the equally numbered output 144 in the FFE 106 of FIG. 3. Not shown in the layout 290 of FIG. 7 are the multiplier inputs, the delay elements, and the interconnections between the multiplier inputs and the delay elements. Conveniently, the delay elements of the tapped delay line are designed to be of the same physical width as the multipliers, thus making it a relatively simple matter to design the interconnections between the output taps of the tapped delay line and the corresponding multiplier inputs to have the same length. The physical layout 290 of FIG. 7 illustrates techniques to ensure that the lengths of interconnecting tracks between corresponding elements of the delay line and the "n" multipliers are substantially equal, and the lengths of interconnecting tracks between the outputs of the multipliers and inputs of the first layer adders are substantially equal, and the lengths of interconnecting tracks between the adder inputs of each subsequent layer of adders and the adder outputs of the preceding layer of adders are substantially equal.

Notwithstanding the benefits of the hierarchical adder approach, some meandering of the physical interconnection between cells is required in order to equalize the lengths for all paths. This is complicated by the fact that the multipliers must be distributed over the full length of the delay elements. Thus, the amount of distance that must be traversed by the interconnections from the taps at the extremities of the FFE delay line is much larger than those taps that are closest to its midpoint. In the interest of minimizing the lengths and conserving area on the die, it may also be necessary for some interconnections to cross others.

FIG. 7 illustrates how this issue is addressed in the embodiment of the present invention using the nine-tap FFE 106. Essentially, the first stage adders (e.g. a1) are interleaved with their respective groups of multipliers (e.g. m1, m2, m3). In so doing, the distance that must be traversed between multipliers and adder is minimized and the demands placed on the interconnections 292 relaxed. This allows for the interconnections 292 to be realized without significant penalty in one of the lower level metal layers, which for most IC technologies exhibit higher levels of capacitance and resistance. For the next level of the hierarchy, where the distances to be traversed are much longer, the upper metal layers, which exhibit lower capacitance and resistance, are used (interconnections 294). By managing the use of the IC's metal layers in this way, the meandering that is required to equalize the delays between blocks can proceed in the knowledge that the parasitic capacitance and resistance of the interconnect is minimized.

Data Recovery 112 (FIG. 8)

The data recovery block 112 is illustrated in a functional block diagram in FIG. 8. To recapitulate from the summary description above, the data recovery 112 converts the analog signal at the analog data input 158 into a raw digital signal at the raw data output 163 and into the retimed data signal 118 at the output 164, having retimed it with the recovered clock 120.

The data recovery 112 comprises the data discriminator 113 and a D-type flip flop 306. The data discriminator 113 includes an a "dual input comparator with high speed multiplexer circuit" (comparator for short) 300, an analog adder stage 302, and a decision circuit 304. The D-type flip flop 306 is a conventional D-type flip flop, and includes a master stage 308, having inputs D1, Ck1 and an output Q1, and a slave stage 310 having inputs D2, Ck2 and an output Q2.

The signals of the data recovery 112 are all of a differential nature, and the circuit blocks are also differential, as will be evident in the more detailed Figures to follow. However, in FIG. 8, in order to keep the description more readily understood, the adjective "differential" is omitted from the names of circuit blocks and signals, although it may be implied.

A primary input 312 of the comparator 300 is connected to the analog data input 158. The comparator 312 also has a secondary input 314, used for injecting a test signal, and a select input 316 used for selecting between the primary and the secondary inputs.

The analog adder stage 302 accepts three input signals 318, 320, and 322, and generates an output signal 324.

The output of the comparator 300 supplies the signal 318 which is connected to the analog adder stage 302. The other two inputs of the analog adder stage 302 (signals 320 and 322) are connected to the DFE Feedback Input 162 and the Slice Level Input 160 of the Data Recovery 112 respectively.

The output of the analog adder stage 324 is connected to the input of the decision circuit 304 with the analog signal 324. The output of the decision circuit 304 is a digital signal 326 which is connected to the Raw Data Output 163 of the of the Data Recover 112 as well as to the D1 input of the master latch 308 of the D-type flip flop 306.

The D-flip flop 306 having a master latch 308 and a slave latch 310 is clocked from the Clock Input 156 of the data recovery 112, where the Clock Input 156 is directly connected to the Ck1 input of the master latch 308, and in inverted form to the Ck2 input of the slave latch 310, inversion being indicated in FIG. 8 by a small circle (the clock signal being a differential signal, inversion may be accomplished by a simple reversal of the leads).

The output Q1 of the master latch 308 of the D-type flip flop 306 is coupled to the input D2 of the slave latch 310, as well as to the DFE Sign Control Output 166 of the Data Recovery 112.

The output Q2 of the slave latch 310 of the D-type flip flop 306 is coupled to the Retimed Data Output 118 of the Data Recovery 112.

The operation of the Data Recovery 112 cannot be completely appreciated without considering the operation of the Clock Recovery 110 and the Decision Feedback Equalizer DFE 114, a cursory explanation of which will be provided here, but a detailed description of which is provided later.

The analog data signal 312 (from the FFE 106) contains the recovered optical signal, already processed to normalize its amplitude (AGC and Filter 102) and is partially equalized (FFE 106).

The function of the comparator 300 is to convert the analog signal at its primary input 312 which is a voltage signal, into the output signal 318 which is a (differential) current signal. A secondary function of the comparator is, for test purposes, to permit a test signal applied at its secondary input 314 to be substituted, under control of the select input 316. The circuitry of the comparator 300 with the analog adder stage 302 will be described in detail below with regard to FIG. 12.

The signals 320 and 322 from the DFE Feedback Input 162 and the Slice Level Input 160 respectively are current signals. The function of the analog adder stage 302 is simply to sum all (differential) current signals, and generate the (differential) analog voltage signal 324. In fact, the analog adder stage 302 is conveniently implemented in the form of the pair of load resistors to the comparator 300 as shown in FIG. 12 below. It may be noted that the signals 320 from the DFE Feedback Input 162 (the differential DFE feedback signal) must be subtracted, rather than added. Subtraction of a differential signal is effected by addition after reversing the (differential) signal leads, as shown in FIG. 12 below.

The analog voltage signal 324 is converted into a digital signal (the Raw Data Output 163) by the decision circuit 304 which is a conventional saturating amplifier stage that converts any analog input signal that is above a certain threshold into a logic '1' signal, and a signal below the threshold into a logical '0' signal. The decision circuit 304 of the embodiment of the invention being a differential circuit and dealing with differential signals, the value of the analog input signal 324 is considered to be the difference between the positive and negative leads (324P and 324N), and the threshold of the decision circuit 304 is zero. Thus a digital (differential) signal representing logic '1' is generated when the voltage of the positive input (324P) is greater than the voltage of the negative input (324N), otherwise a logic '0' is generated.

While the main signal to be detected in the discriminator 113 is the recovered optical signal (analog data signal 312), that signal may have pulse width distortion (unequal positive and negative pulse shapes) and remaining inter-symbol interference.

The slice level input 160 (input 322 of the analog adder stage 302) may be programmed to provide a constant or slowly varying offset to effectively shift the slicer threshold away from zero, and thus compensate for the pulse width distortion. This is illustrated in FIGS. 9 and 10.

FIG. 9 shows three eye diagrams (a), (b), and (c), exhibiting the effect of pulse width distortion. Each eye diagram comprises pulse shapes and a line indicating the center of eye. In the case of eye diagram (a), the center of eye is also indicated as a decision threshold.

The function of the threshold of the decision circuit 304 is to slice the eye diagram or data at the point where the probability distributions of zero and one bits intersect in order to minimize bit errors. In an ideal condition (eye diagram (a)), the distributions of noise around low output representing zero bit and high output representing one bit have equal pulse widths resulting in a symmetrical eye, which mean the optimum slice level threshold occurs at the center or mid-point (50%) of the eye, that is halfway between the zero and one levels on the vertical axis. This is shown in the "undistorted eye diagram crossing at eye center" (a) of FIG. 9.

In reality, the noise distributions are not equal. Depending on the type of optical amplifiers and photo-detectors used, there could be more noise on the high output than the low output or vice versa and the result are unequal pulse widths for high and low outputs. The unequal pulse width of high and low is described as pulse width distortion or duty cycle distortion. Evidence of pulse width distortion can be observed in the eye diagram (b) "eye crossing below center of eye" where the eye crossings are offset down from the vertical midpoint of the eye (the center of eye). Similarly, the eye diagram (c) "eye crossing above center of eye" where the eye crossings are offset up from the vertical midpoint of the eye.

In the event of pulse width distortion, the optimum decision (slice level) threshold no longer occurs at the center of the eye, but should be below the center of the eye in diagram (b), or above the center of the eye in diagram (c) of FIG. 9.

The slice level input 160 (FIG. 8) introduces the differential DC offset signal 322 into the adder stage 302 which effectively causes the output signal waveform to shift. FIG. 10 shows an example of a shifted differential waveform with a DC offset (diagram (a)), and the effect on the effective threshold in an eye diagram (b).

Illustrated in diagram (a) is a hypothetical pulse, showing the actual signals (positive lead and negative lead) of a differential signal, and the decision threshold (which is at zero). The positive lead is shifted up by a value of +DC offset, while the negative lead is shifted down by an equal but opposite amount −DC offset. As a result, the decision threshold crosses at the same point as the two halves of the pulse shape.

Thus, without changing the actual threshold of the decision circuit 304, the use of differential signals throughout, and the addition of the differential slice level input 160 to the output signal 318 of the comparator 300, permits the effective threshold to be shifted to match the optimum point, corresponding to the eye crossing, as illustrated in the diagram (b) of FIG. 10.

Figure 11:
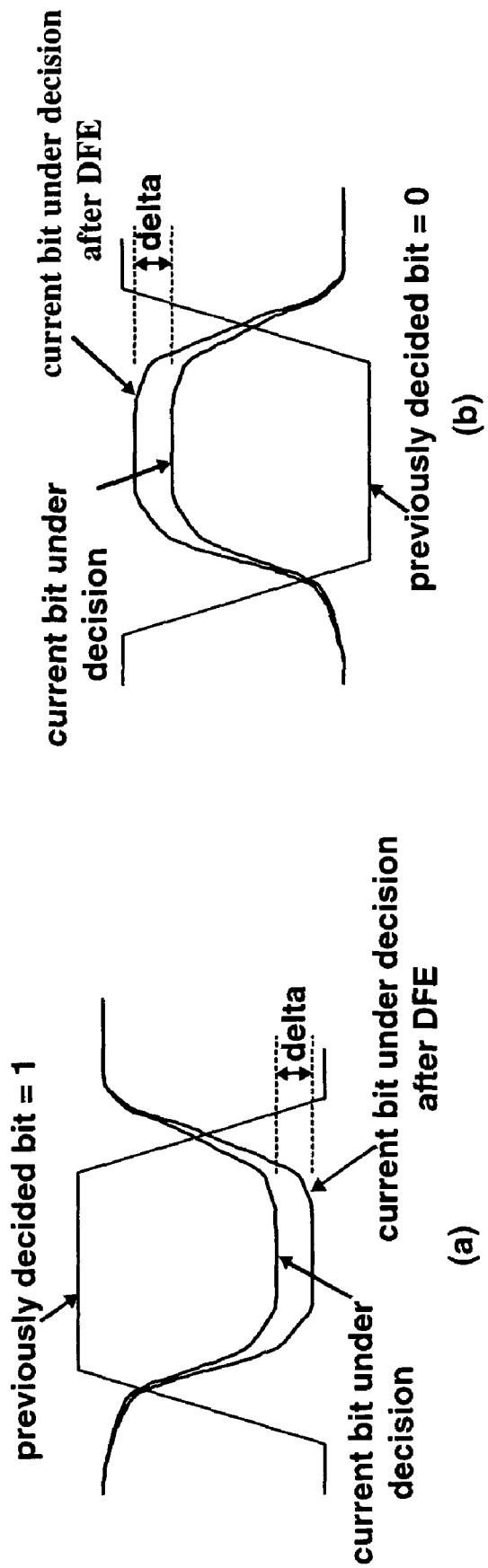
FIG. 11 shows diagrams to explain the DFE (Decision Feedback Equalizer) functionality.

The theory of the DFE (Decision Feedback Equalizer) functionality is briefly explained with the aid of FIG. 11.

The remaining inter-symbol interference (remaining after processing through the FFE 106) has the effect that the wave form of a data bit is somewhat affected by (contains a memory of) the previous bit. The function of the D-type flip flop 306 retains the value of the previous bit (logic value '1' or '0'), and provides, through the DFE 116, a compensating offset current (positive or negative, depending on the logic value) as the DFE Feedback Input 162 to the input 320 of the analog adder stage 302.

The DFE 116 not only mitigates some of the post-cursor ISI components that remain after the linear equalizer, Feed Forward Equalizer (FFE) 106, which was discussed in the previous sections, but it can also reduce possible noise enhancement (amplification) which is caused by the combined weighted action of the received signals in the FFE 106.

The DFE operation uses the previously decided bit (DFE Sign Control Output 166) to cancel the inherent ISI components that exist in the current bit. If the preceding bit (the decided bit) is a one or a high, then a small fraction of the high bit value is subtracted from the signal level of the current bit. Conversely, if the preceding decided bit is a zero or a low, a small fraction of the low bit value is added to the signal level of the current bit.

An example of this is illustrated in FIG. 11 shows the resultant output waveforms after DFE in diagrams (a) and (b) when the previous decided bits are one and zero, respectively.

The diagram (a) of FIG. 11 shows a trapezoidal waveform "previously decided bit=1", a waveform "current bit under decision", and another waveform "current bit under decision after DFE". The waveforms are somewhat idealized in order to illustrate the operation more clearly. Bearing this in mind, the waveform "previously decided bit=1" corresponds roughly to the DFE Sign Control Output 166, the waveform "current bit under decision" corresponds roughly to the output signal 318 of the comparator 300, and the waveform "current bit under decision after DFE" corresponds roughly to the output 324 of the adder stage 302 (ignoring the effect of the Slice Level Input 160). The waveform "current bit under decision after DFE" is separated from the waveform "current bit under decision" by a small value "delta" which corresponds to the signal 320 from the DFE Feedback Input 162.

The diagram (a) thus shows how the waveform "current bit under decision after DFE" is derived by subtracting the small value "delta" (derived from the DFE Feedback Input 162) to the waveform "current bit under decision" when the previously decided bit was a high.

The diagram (b) of FIG. 11 shows in a similar way how the waveform "current bit under decision after DFE" is derived by adding the small value "delta" (derived from the DFE Feedback Input 162) to the waveform "current bit under decision" when the previously decided bit was a low.

While the diagrams of FIG. 11 show a unipolar representation of signals (as if referenced to "ground", and the embodiment of the invention is based on differential signals (each signal being carried on two leads referenced to each other), it is understood that the signals diagrammed in FIG. 11 may also be construed as showing the differential values of the various differential signals referenced.

The Raw Data Output 163 from the decision circuit 304 represents a possibly noisy digital signal with slow edges. To convert this raw signal into a "proper" digital signal, requires that a clock signal be generated and the raw data signal be retimed. The clock is generated from the Raw Data Output 163 by the Clock Recovery 110 (described in detail below), which provides the Clock Input 156 to the Data Recovery 112. The functions of clock and data recovery are conventionally often combined in a block entitled Clock and Data Recovery 109 (CDR). In the present description of the embodiment, these functions are described separately because each contains a number of innovations.

Comparator 300 and Adder Stage 302 (FIG. 12)

An example of the circuitry that may be used to implement the Comparator 300 and the Adder Stage 302 is illustrated in FIG. 12.

As mentioned earlier, the Adder Stage 302 merely contains two resistors (R1006 and R1007) between the supply voltage Vcc and the differential inputs 318, 320, and 322, as well as the differential output 324. As shown in FIG. 12, all inputs and the output of the adder stage 302 are joined together, thus providing the function of summing all input currents, and providing an output voltage that is proportional to the sum of the currents, multiplied by the value of the resistors (load resistors) R1006 and R1007.

The Comparator 300 comprises an interconnection of amplifiers with selectable inputs, made up of three sections, a common output stage 330, and two input stages 332 and 334. The Adder Stage 302 is coupled to the output stage 330 of the Comparator 300 through the differential signal 318.

The first input stage 332 includes three transistors (Q1001, Q1002, and Q1003), five resistors (R1001 R1002, R1003, R1004, and R1005), and two capacitors (C1001 and C1002).

The differential primary input signal 312 (corresponding to the Analog Data Input 158, see also FIG. 8) is applied to the bases of the transistor Q1002 (positive lead 312p) and the transistor Q1001 (negative lead 312n). A resistor/capacitor network comprising R1001 in series with R1002 and C1001 in parallel joins the emitter of Q1001 to the collector of the transistor Q1003. A similar R/C network comprising R1004 in series with R1003 and C1002 in parallel joins the emitter of Q1002 to the collector of Q1003. The transistor Q1003 implements a switchable current source: the emitter of Q1003 is connected to ground via the resistor R1005, while the base of Q1003 is connected to the signal 316p. The signal 316p is the positive lead of the (pseudo-) differential signal 316.

The second input stage 334 includes three transistors (Q1007, Q1008, and Q1009), five resistors (R1011, R1012, R1013, R1014, and R1015), and two capacitors (C1004 and C1005). The second input stage 334 is identical in structure with the first input stage 332, but receives the differential secondary signal 314 as inputs (bases of Q1007 and Q1008), and the signal 316n, the signal 316n being the negative lead of the (pseudo-) differential select input 316.

The output stage 330 includes three transistors (Q1004, Q1005, and Q1006), three resistors (R1008, R1009, R1010), and a capacitor C1003.

A current source is formed by the transistor Q1006 and the resistor R1010 (connected between the emitter of Q1006 and ground) and a bias voltage source Vbias (connected to the base of Q1006). The collector of Q1006 is connected to R1009. The other terminal of R1009 is connected to the supply voltage Vcc through R1008. The junction of R1008 and R1009 is further bypassed to ground through the capacitor C1003, and connected to the bases of the transistors Q1004 and Q1005.

The input stages 332 and 334 are connected to the output stage 330 as follows: the collectors of Q1001 and Q1007 of the input stages 332 and 334 respectively are connected to the emitter of Q1004 of the output stage 330. The collectors of Q1002 and Q1008 are connected to the emitter of Q1005 in a similar manner.

The output of the Comparator 300 as a whole (the differential analog signal 318, a current) is provided by the output stage 330 through the collectors of the transistors Q1004 and Q1005, and is connected to the adder stage 302 (which provides load resistors R1006 and R1007).

As mentioned earlier, the Comparator 300 provides a test feature, i.e. it allows a test signal (secondary signal 314) as its input instead of the primary input signal 312. One or the other signal is selected through the select input 316. The select input 316 turns one or the other input stage (332 or 334) on, while turning the other input stage off. Thus when the select input 316 is ON, i.e. the positive lead 316p carries a positive bias voltage while the negative lead 316n is zero, the current source (Q1003, R1005) of the first input stage 332 provides current, and the first input stage 332 is able to amplify the primary input signal 312 (from the analog data input 158). At the same time, no current flows in the second input stage 334. Conversely, when the select input 316 is OFF (316p is zero, 316n is positive bias voltage), the first input stage 332 is disabled, while the second input stage 334 amplifies the test input signal 314.

The combination of input stages (332, 334) and output stage (330) form a cascode amplifier of improved bandwidth. In addition, the degeneration resistors (R1001 to R1004 and R1011 to R1014) and the peaking capacitors (C1001, C1002, C1004, C1005) are used to further improve the bandwidth. The degeneration resistors serve a couple of purposes: to improve the input voltage signal dynamic range (extending the input voltage range by R times the tail current) over which the amplifier behaves approximately as a linear amplifier; and to create a local negative feedback in which the overall gain of the comparator 300 is reduced by the same factor and as such that the ratio of the degeneration resistors to the load resistors (in the adder stage) defines the gain of the comparator 300.

The gain can be made process independent by ensuring the resistor types and dimensions are kept the same. A potential problem with degeneration resistors is that they introduce a high frequency pole which degrades the bandwidth of the overall amplifier if the resistor is made too large. This can be compensated for by adding peaking capacitors in parallel with the resistors as shown above, which creates a zero to counter the high frequency pole. The result is improved bandwidth.

Slicing Level Control 108 (FIG. 13)

The differential input 146 of the Slicing Level Control 108 are connected to the Slicing Level Control signal 128 (see FIG. 2) supplied by a D/A converter (DAC, not shown), while the output 148 of the Slicing Level Control 108 is connected (as input signal 322) to the adder stage 302 in the data recovery 112 (see FIG. 8 and FIG. 12 for details). The signal supplied by the D/A converter is a differential current (flowing towards the negative supply), while the input signal to the adder stage 302 is also a differential current but flowing to the positive supply terminal. Thus the functionality of the Slicing Level Control 108, having means for generating the slicing level input signal 322 to the adder stage in the form of a differential current, is comparable to that of a differential current mirror.

A circuit diagram of the Slicing Level Control block 108 is shown in FIG. 13. The circuit 108 comprises eight transistors (Q1101, to Q1108); of these, three transistors (Q1101, Q1102, and Q1104) are connected as diodes, i.e. they have their collectors tied to their bases, and will be referred to as diodes. The circuit 108 further comprises five resistors (R1101 to R1105) and a capacitor (C1001).

The input terminals 146n and 146p are connected to the bases of Q1106 and Q1105 respectively, as well as to the anodes (bases) of the diodes Q1101 and Q1104 respectively. The cathodes (emitters) of the diodes Q1101 and Q1104 are joined, and connected to the base of the transistor Q1103 and the anode (base) of the diode Q1102. The cathode (emitter) of Q1102 is connected to the supply Vee via the resistor R1101. Similarly, the emitter of Q1104 is connected to the supply Vee via the resistor R1102.

The collectors of Q1106 and Q1105 are connected to the emitters of the transistors Q1107 and Q1108 respectively. The bases of Q1107 and Q1108 are joined together and connected to a biasing node 340 created by a chain of circuit elements comprising R1105, R1104, Q1107, and R1103, where R1105 is connected between Vcc and the biasing node 340; R1104 between the biasing node and the collector of Q1107; the emitter of Q1107 is connected to the Vee supply via R1103; and the base of Q1103 is connected to a Vbias supply.

The differential output 148 of the Slicing Level Control 108 is taken from the collectors of Q1107 (148p) and Q1108 (148n).

The circuit functions as a differential cascode amplifier, in which the sum of the input currents (signals at 146n and 146p) is converted into a voltage drop across Q1102 and R1101 in series. A current source (Q1103 and R1102) is biased by the voltage drop, whereby the ratio of the current of the current source to the sum of the input currents is determined by the ratio of R1102: R1101. Having thus set the common bias current of the cascode amplifier, the difference in current (the differential signal) between the two inputs 146n and 146p gives rise to differing voltage drops across the diodes Q1101 and Q1104 which in turns results in proportionately differing currents in the differential pair of input stage transistors Q1106 and Q1105. These currents are then simply translated to the output terminals (148n and 148p) through the output stage transistors Q1107 and Q1108.

The reason for using a cascode amplifier configuration for the slice level control 108 is to match the voltage levels in the comparator 300, which uses a cascode amplifier configuration, and to ensure the devices are not saturated. Q1101 and Q1104 provide a diode voltage drop to ensure the voltage across the tail current source Q1103 and degeneration resistor R1102 is not saturated. Q1102 with degeneration resistor R1101 is the current source that sinks currents from the DAC currents 146n and 146p and this current source is mirrored, but scaled down in current by Q1103 and R1102 which forms the tail current for the differential transistor amplifier pair. The product of the scaled tail current from Q1103 and the load resistor R1006 and R1007 in the adder stage 302 (in FIG. 10) represents the maximum voltage offset range in which the slice level control will operate per side. Because of the differential nature of the circuit, the minimum offset voltage occurs when 146n and 146p are the same values. The maximum offset voltage occurs on 148n when 146p is at maximum and its complementary current 146n is at the minimum. Conversely, when 146p is at minimum and 146n is at maximum, a maximum offset voltage occurs at 148p. The incremental steps in the DAC currents 146p and 146n are digitally controlled by the DAC bits. The step size offset voltage is determined by taking twice the maximum offset voltage divided by number of steps which is defined by 2r, where "r" is the number of DAC bits. To be process and temperature independent, an external resistor is used to generate a reference current for the DAC currents and at the same time the value of this resistor can also be used to provide an added flexibility to adjust the step offset voltage size.

Decision Feedback Equalizer DFE 114 (FIG. 14)

The functionality of the DFE within the receiver circuit 100 was described above with the aid of FIG. 11.

The DFE 114 (FIG. 2) receives the digital DFE sign control input 170 from the Data Recovery 112 (DFE sign control output 166) and has means for generating an (analog) DFE feedback signal in the form of a differential current at the DFE feedback output 172 (comprising first and second DFE feedback terminals 172p and 172n respectively) which is connected to the decision feedback input 162 of the Data Recovery 112. The magnitude of the analog feedback signal is proportional to the magnitude of the DFE weight 130 (DFE weight input 168 of the DFE 114), while the sign is controlled by the DFE sign control input 170.

A circuit diagram of the Decision Feedback Equalizer DFE 114 is shown in FIG. 14. The circuit 114 comprises eleven transistors (Q1301, to Q1311); of these, four transistors (Q1301, Q1302, Q1306, and Q1307) are connected as diodes, i.e. they have their collectors tied to their bases, and will be referred to as diodes. The circuit 114 further comprises five resistors (R1301 to R1305).

The transistors Q1310 and Q1311 are grouped as "CML pair 1", and similarly the transistors Q1308 and Q1309 are grouped as "CML pair 2". In each group, the emitters of the transistors are joined together.

The bases of Q1311 and Q1308 are joined together and connected to the positive terminal of the DFE sign control input 170 (170p), and similarly, the bases of Q1310 and Q1309 are joined together and connected to the negative terminal of the DFE sign control input 170 (170n). The collectors of Q1311 and Q1309 are joined together and connected to the positive terminal of the DFE feedback output 172 (172p) and similarly, the collectors of Q1310 and Q1308 are joined together and connected to the negative terminal of the DFE feedback output 172 (172n).

The two CML pairs thus form two simple differential amplifier stages connected in parallel but with their outputs crossed (inverted).

The remaining circuitry provides tail current sources to the CML pairs 1 and 2 as follows.

The collectors of the transistors Q1303 and Q1304 are joined together and connected to the joined emitters of Q1310 and 1311 (CML pair 1). The emitters of Q1303 and Q1304 are connected to the supply terminal Vee via the resistors R1302 and R1303 respectively. The combination of the transistor Q1303 with the resistor Q1302 is a first single ended current source. The combination of the transistor Q1304 with the resistor Q1303 is a second single ended current source. The currents flowing into the collectors of Q1303 and Q1304 (provided by the first and second single ended current sources respectively) are labeled I1301 and I1302 respectively.

The collector of the transistor Q1305 is connected to the joined emitters of Q1309 and Q1308 (CML pair 2). The emitter of Q1305 is connected to the supply terminal Vee via the resistor R1304. The combination of the transistor Q1305 with the resistor R1304 is a third single ended current source. The current flowing into the collector of Q1305 (provided by the third single ended current source) is labeled I1303.

The CML pairs 1 and 2 are switching means having first and second states for directing the currents (I1301, I1302, I1303) supplied by the first, second, and third single ended current sources respectively, to the first and second DFE feedback terminals 172p and 172n respectively, wherein in the first state the first and second current sources are connected to the first DFE feedback terminal, and the third current source is connected to the second DFE terminal; and in the second state the first and second current sources are connected to the second DFE feedback terminal, and the third current source is connected to the first DFE terminal.

The base of Q1302 is connected to a positive biasing node 350, while the bases of Q1304 and Q1305 are connected to a negative biasing node 352. The biasing nodes are derived from voltage dividers connected to the positive (first) and negative (second) DFE weight terminals of the DFE weight input 168 (i.e. terminals 168p and 168n), the DFE weight signal having corresponding first and second single ended signals. The positive biasing node 350 is connected to cathode (emitter) of the diode Q1301, the anode (base) of which is connected to the terminal 168p. The positive biasing node 350 is further connected to the anode (base) of the diode Q1302, the cathode (emitter) of which is connected to the supply terminal Vee via the resistor R1301. In similar fashion, the negative biasing node 352 is connected to cathode (emitter) of the diode Q1307, the anode (base) of which is connected to the terminal 168n. The negative biasing node 352 is further connected to the anode (base) of the diode Q1306, the cathode (emitter) of which is connected to the supply terminal Vee via the resistor R1305.

The challenge is that the DFE implementation has to operate at the full data rate, in particular if the data rate is 10 Gb/s or higher. The propagation time from the retimed bit (DFE sign control output 166), through the DFE circuit 114 performing the multiplication of the DFE weight 168 with the retimed bit (i.e. its sign), plus the summation action of the DFE feedback output 172 with the current bit from the output of the differential input comparator 300 must be completed in less than the data rate period (i.e. 100 picoseconds or less). The propagation delay of each block: decision circuit 304, first latch 308, and DFE circuit 114, must be minimized. This can be achieved by using technology with transistors that have the highest transition frequency ($f_T$) performance, careful circuit layout to minimize parasitic loads, and utilize a circuit topology that can achieve the highest switching speed.

The decision circuit 304, the latch 308, and the DFE circuit 114 utilize Current Mode Logic (CML) to achieve fast switching speed. A CML circuit topology consists of a differential matched transistor pair amplifier with their emitters tied to a common tail current with sufficient currents to ensure that the transistors are operating at peak fT when the differential pair is fully switched. As the name of the topology implies, the differential pair switches the tail current. The DFE circuit 114, which uses the single-tap weight (DFE weight input 168) as the filter coefficient, is an example that employs a CML approach to ensure that the CML differential pair switches at the highest speed.

The operation of the DFE circuit 114 is as follows. The inputs, 170p and 170n, of the matched differential transistor pairs (Q1308 and Q1309) and (Q1310 and Q1311) receive the differential signals of the retimed bit which cause the differential pairs to completely switch. The reason for using two CML differential pairs is because the required current, I1301 defined by Q1303 and degeneration resistor R1302, used to scale the bit signal amplitude, can vary from zero to a large value depending on the specified weight controlled by the DAC current. The switching speed of the CML differential pair 1 (Q1310 and Q1311) can be impaired due to variations in the tail current I1301 which is controlled by the positive DFE weight input current (from a DAC) 168p via the tail current Q1302 and R1301. To ensure that the CML pair always has sufficient tail current to switch at speed, another tail current (Q1304 and degeneration resistor R1303), I1302, is connected in parallel with I1301. I1302 tail current is mirrored from the current source Q1306 and degeneration R1305 which sinks current from the negative DFE weight input current (from a DAC) 168n, which is the complementary current for 168p. At the same time, another CML differential pair 2 (Q1308 and Q1309) has its tail current, I1303, generated by Q1305 and degeneration R1304, mirrored from the tail current (Q1304 and R1303) to arrive at the same value as I1302. In order to cancel out the I1302 current generated in the main CML differential pair 1, the CML differential pair 2 has its outputs connected in opposite polarity to CML pair 1. The resulting net current at the DFE feedback output 170 is I1301, changed in polarity due to the inverting action of the CML pairs. This differential current is then summed with the currents at the (differential) output current (signal 318) of the comparator 300, and the output 148 of the slicing level control 108 in the adder stage 302, as described earlier (FIG. 8).

Clock Recovery 110 with Phase Offset Control 104 (FIG. 15)

The Clock Recovery 110 with Phase Offset Control 104 from FIG. 2, are combined in FIG. 15, showing a Phase Adjustable Clock Recovery circuit 400. The Clock Recovery 110 is described in sufficient detail to permit the appreciation of the innovative features contained in the Phase Offset Control 104.

The Clock Recovery 110 comprises the following blocks:

A Phase Frequency Detector PFD 402, a Charge Pump 404, a Differential Loop Filter 406, a Voltage Controlled Oscillator VCO 408, a Flip Flop FF 410, and a Differential Exclusive OR Gate XOR 412. These blocks are all based on differential circuit technology and interconnected with differential signals labeled with descriptive abbreviations. Each signal has both a positive and a negative lead, identified with _P and _N suffixes respectively.

The Charge Pump 404 is illustrated in further detail in FIG. 16 below. The PFD 402 has two inputs, DATA_IN (DATA_IN_N and DATA_IN_P) connected to the raw data input 152, and CK_IN (CK_IN_N and CK_IN_P) receiving an output of the VCO, this output simultaneously providing the recovered clock output 154 of the Clock Recovery 110. The PFD 402 provides two differential output signals, UP (UP_N and UP_P) and DN short for Down (DN_N and DN_P), both directly connected to inputs of the Charge Pump 404. An output node of the Charge Pump is labeled FILT (FILT_N and FILT_P). The node FILT is also connected to the Differential Loop Filter 406, and an input of the VCO 408. In addition, the node FILT is connected to receive an input from the offset input 150 which in turn is driven by the offset current output 138 of the Phase Offset Control 104.

Two additional signals are output from the PFD 402, RTD short for "Retimed Data" (RTD_P and RTD_N), and RCK short for Recovered Clock (RCK_P and RCK_N). These two signals are conveniently generated by an implied data recovery circuit with the PFD 402; as their names suggest, these signals could also be obtained from the Data Recovery 112. Alternatively, the circuits could be redrawn to include the Data Recovery 112 within the PDF 402, which might possible be less clear.

The signal RTD is input to a retiming flip flop FF 410 which is clocked by RCK. The output of the FF 410 is a delayed signal RTDD short for "Retimed Data Delayed" (RTDD_N and RTDD_P) which forms one of the inputs of the differential XOR gate 412, the other input being RTD. The XOR 412 is a means for generating the Phase Offset Enable signal at the output 155 which is coupled to the Phase Offset Enable input 137 of the Phase Offset Control 104.

The blocks PFD 402, Charge Pump 404, Differential Loop Filter 406, and the VCO 408, form a conventional phase locked loop (PLL), the utility of which is enhanced by the innovative addition of the Phase Offset Control 104 which is enabled (gated) on each data transition, data transitions being detected by the combination of the retiming FF 410 and the XOR 412.

The entire circuit being differential, some circuit details deserve additional explanations. The Differential Loop Filter 406 contains two sets of RC elements (RP and CP connected in series from FILT_P to ground (Vcom), and RN and CN connected in series from FILT_N to ground (Vcom). The Charge Pump 404 is illustrated in further detail in FIG. 16.

Charge Pump 404 (FIG. 16)

A simplified circuit diagram of the charge pump is presented in FIG. 16.

The circuit contains a first positive current source 420, a second positive current source 422, a Common Mode Control 424, a first differential switch (up-switch) 426, a second differential switch (down-switch) 428, a first negative current source 430, and a second negative current source 432. Each of the differential switches comprises two transistors, Q1801 and Q1802 in the up-switch 426, and Q1804 and Q1805 in the down-switch 428. The first negative current source 430 is comprised of a transistor Q1803 and a resistor R1801, while the second negative current source 432 is comprised of a transistor Q1806 and a resistor R1802.

The positive current sources 420 and 422 are placed between the positive supply Vcc and the output node FILT of the charge pump 404, the positive current source 420 being coupled to the positive terminal FILT_P, and the positive current source 422 being coupled to the negative terminal FILT_N. Each of the positive current sources 420 and 422 has a biasing input labeled "Vbias_pump_p", both of which are connected to the output of the Common Mode Control 424.

The Common Mode Control 424 has a reference input labeled "Vref", and two signal inputs which are connected to the output node FILT of the charge pump 404 (FILT_N and FILT_P) respectively.

The output node FILT is further connected to the collectors of the transistors in the differential switches, specifically FILT_N is connected to Q1801 and Q1804, while FILT_P is connected to Q1802 and Q1805.

The emitters of the transistors Q1801 and Q1802 are tied together and connected to the collector of the transistor Q1803, the bases of Q1801 and Q1802 being connected to the input signals UP_P and UP_N respectively. The emitter of Q1803 is connected to the negative supply Vee via the resistor R1801, while its base is connected to a bias supply "Vbias_pump_n".

Similarly, the emitters of the transistors Q1804 and Q1805 are tied together and connected to the collector of the transistor Q1806, the bases of Q1804 and Q1805 being connected to the input signals DN_N and DN_P respectively. The emitter of Q1806 is connected to the negative supply Vee via the resistor R1802, while its base is connected to the bias supply "Vbias_pump_n".

The function of the charge pump 404 is to charge the differential loop filter 406 (differential node FILT) with a fixed current in the "up" or "down" direction whenever either the differential "UP" logic input or the "DN" logic input is true (UP_P>UP_N and DN_P>DN_N respectively). When both "UP" and "DN" are false, no charge occurs, and the charge pump is in the "off" state. Thus, three charging states are implemented corresponding to the "off", "up", and "down" states.

The differential loop filter 406 being a differential circuit, a differential current is required to be sent into the node FILT by the charge pump 404, either "up" or "down", or no current in the case of "off".

The current from the positive current sources 420 and 422 (Ipump_p), is absorbed by the negative current sources 430 and 432 (Ipump_n) respectively. The voltage potential of the nodes FILT_N and FILT_P, being only connected to current sources in the charge pump 404, is floating, and would drift in a positive or negative direction, depending on the magnitude of the currents.

The current in the negative current sources 430 and 432 is controlled and fixed by the bias voltage Vbias_pump_n. Similarly, the current in the positive current sources 420 and 422 is controlled by the bias voltage Vbias_pump_p. In order to match the current in positive current sources 420 and 422 with the current in the negative current sources 430 and 432, the bias voltage Vbias_pump_p is generated by the Common Mode Control 424. The Common Mode Control 424 monitors the average voltage $(V_{FILT\_}{}^P + V_{FILT\_}{}^N)/2$ against the reference input Vref, and controls the bias voltage Vbias_pump_p (thus, controlling the amount of current in the positive current sources 420 and 424), to maintain the average voltage at the desired level.

When the charge pump 404 is "off" (Q1801 and Q1805 being OFF, Q1802 and Q1804 being ON), the current from the positive current source 420 flows past the node FILT_P through the transistor Q1802 into the negative current source 430; and the current from the positive current source 422 flows past the node FILT_N through the transistor Q1804 into the negative current source 432. As all currents are balanced, no net differential current flows between FILT_P and FILT_N.

When the charge pump 404 is set to "up", (Q1802 and Q1805 being OFF, Q1801 and Q1804 being ON), the current Ipump_p from the positive current source 420 is blocked by Q1802 and is thus forced to flow into node FILT_P. Similarly the current of the negative current source 430 is blocked, and forced to drain from the node FILT_N. As a result, a differential current (equal in magnitude to Ipump_p or Ipump_n, which are equal) flows at the differential node FILT, to charge the differential loop filter 406.

In analogous fashion, when the charge pump 404 is set to "dn", (Q1801 and Q1804 being OFF, Q1802 and Q1805 being ON), the current Ipump_p from the positive current source 422 is blocked by Q1804 and is thus forced to flow into node FILT_N. Similarly the current of the negative current source 432 is blocked, and forced to drain from the node FILT_P. As a result, a differential current (equal in magnitude to Ipump_p or Ipump_n which are equal) flows at the differential node FILT, to discharge the differential loop filter 406.

Phase Offset Control Circuit 104 (FIG. 17)

The Phase Offset Control circuit 104 is a differential circuit comprising fourteen transistors (Q1701, to Q1714); of these, six transistors (Q1701, Q1702, Q1703, Q1711, Q1712 and Q1713) are connected as diodes, i.e. they have their collectors tied to their bases, and will be referred to as diodes. The circuit 104 further comprises four resistors (R1701 to R1704) and a bypass capacitor C1701.

The circuit 104 has two differential inputs, the Phase Offset Control input 136, and the Phase Offset Enable input 137, and the offset current output 138.

The circuit includes a bias voltage generator 430 generating the bias voltage Vbias comprised of the following elements connected in series from the positive supply Vcc to R1704, to the anode of Q1712, from the cathode of Q1712 to the anode of Q1713, from the cathode of Q1713 to the collector of Q1714, from the emitter of Q1704 via R1703 to Vee. The bias voltage Vbias is output at the anode of Q1712. This node is bypassed to Vee through the bypass capacitor C1701.

The differential input 136 (136p and 136n) is used to indirectly set the operating point of the circuit, including the bias voltage Vbias. Input terminals 136p and 136n are connected to the anodes of the diodes Q1701 and Q1711 respectively. The cathodes of Q1701 and Q1702 are tied together and connected to the anode of Q1702. The cathode of Q1702 is connected to the base of Q1714 thus controlling the bias voltage Vbias.

The cathode of Q1702 is further connected to the anode of Q1703, the cathode of which is connected to Vee via the resistor R1701.

The cathode of Q1702 is further connected to the base of the transistor Q1709, the emitter of which is connected to Vee via the resistor R1702. The combination of the transistor Q1709 and the resistor R1702 forms a current source generating a single ended current.

The inputs terminals 136p and 136n are further connected to the bases of the transistors Q1704 and Q1710 respectively, the emitters of which are tied together and connected to the collector of Q1705.

The input terminals 137p and 137n are connected to the bases of the transistors Q1705 and Q1708, the emitters of which are tied together and connected to the collector of Q1709. The single ended current flowing into the collector of Q1709 is labeled "Ioperating_n".

The bias voltage Vbias (from the anode of Q1712) is connected to the bases of the transistors Q1706 and Q1707, the emitters of which are tied together and connected to the collector of Q1708.

The output terminal 138p is connected to the collectors of Q1704 and Q1706, while the output terminal 138n is connected to the collectors of Q1707 and Q1710. Collectively, the transistors Q1704, Q1706, Q1707, and Q1710 implement means for splitting the generated single ended current into two single ended currents, whose difference forms the differential offset current.

Functionally, the phase offset control circuit 104 comprises a linear to logarithmic converter (Q1701 and Q1711), a logarithmic to linear converter (Q1704 and Q1710), a switching means implemented by a fast switching pair (Q1705 and Q1708), and a first splitting means in the form of a current splitter (Q1706 and Q1707). The logarithmic to linear converter (Q1704 and Q1710), in addition to providing the logarithmic to linear conversion function, provides a second splitting means. The linear to logarithmic converter (Q1701 and Q1711) at the input of the logarithmic to linear converter (Q1704 and Q1710) provides a means for generating a differential output current (that is) proportional to the phase offset control signal, i.e. maps the input current to the output, when enabled by the phase offset enable signal 137 (the transistor Q1705 is "ON" and the transistor Q1708 is OFF, see below). The transistors Q1705 and Q1708 thus represent a switching means for switching between the first and second splitting means, and the second splitting means (Q1704 and Q1710) also represents the means for controlling the magnitude of the differential offset current.

The operating point of the circuit is fixed and controlled by the sum of the analog currents of the Phase Offset Control inputs 136p and 136n (combined in Q1702), which determines the voltage at the base of Q1709 and Q1714, and thus controls the bias voltage Vbias through Q1713, Q1712, and R1704, and also controls the operating current "Ioperating_n" sunk through Q1709.

The output terminals 138p and 138n inject a differential offset current, proportional to the differential current provided by the Phase Offset Control input 136, into the differential loop filter 406 as discussed earlier. For a linear phase-frequency detector (PFD 402), the gain is a linear function of the data transition density. The phase offset control circuit 104 should follow the same linear characteristic such that the phase offset introduced is not dependent on data transition density. The logical Phase Offset Enable input 137 (from the XOR gate 412 (FIG. 15) is used to enable the differential offset current (output 138) to be introduced whenever a data transition was detected in the recovered data. The Phase Offset Enable signal (input 137) generated by the flip flop 410 and the XOR gate 412, resulting in a pulse of one bit period duration, coincident with an edge of the retimed data signal RTD.

When the Phase Offset Enable input 137 signal is OFF, the operating current "Ioperating" is blocked by Q1705 and conducted through Q1708 to the first current splitter (Q1706 and Q1707) which causes substantially equal (single ended) currents to flow in the output terminals 138p and 138n, hence the differential output current is substantially zero. Hence, when there are no data transitions, the operating current is split into two equal parts and sent to the differential loop filter 406, thus maintaining the DC balance of the charge pump 404.

When the Phase Offset Enable input 137 signal is ON, the operating current "Ioperating" is conducted through Q1705 to the logarithmic to linear converter (Q1704 and Q1710). This enables the differential input current (from the Phase Offset Control input 136) to be mapped to the offset current output 138, thus causing the output currents to be unbalanced. The unbalanced currents, being the difference between the split single ended currents, are sent to the differential loop filter 406. The pulse width of the unbalanced current is equal with one bit time.

Operation of Clock Recovery 110 with Phase Offset Control 104 (FIGS. 18, 19) For an undistorted signal, symmetrical on the vertical axis, the optimal eye sampling time will be in the middle of the eye, at 50%. For a distorted eye, performance can be improved by shifting the sampling point away from the eye center. This is accomplished using the Phase Offset (offset from the eye center) Control circuit 104 attached to the clock and data recovery block 110, which extracts the timing information from the raw data signal 152 (DATA_IN) and generates the recovered clock (RCK) and the recovered data (RTD).

The clock recovery comprises a second order phase-locked loop (PLL) with a well defined bandwidth for jitter tolerance and jitter transfer control. The basic PLL architecture consists of the linear phase-frequency detector (PFD 402), the low pass filter with the loop-filter components (Differential Loop Filter 406), the charge pump 404, and the voltage controlled oscillator (VCO 408) configured in a closed loop. A PLL of this type is described in D. Johns, K. Martin, "Analog Integrated Circuit Design", John Wiley and Sons, Inc., 1997.

The phase-frequency detector 402 generates UP and DN pulses for driving the charge pump 404 for every transition in the incoming data (DATA_IN). The width of the UP and DN pulses is a function of the phase error. The phase error is defined as the sampling edge position relative to the eye center.

The ideal linear characteristic of a phase-frequency detector, when the clock and data recovery circuit is locked on the incoming data, is shown in FIG. 18 "Linear Phase Detector Characteristic".

FIG. 18 shows an XY chart, plotting a net charge Qnet (Y-axis) as a function of the Timing Error (X-axis). The range of the X-axis extends from $-Tb/2$ to $+Tb/2$, where Tb is the duration of a bit period, for example 100 picoseconds when the data rate is 10 Gb/s. The range of the Y-axis extends from $-Q$ to $+Q$, the limits of the (differential) range of the charge in the filter capacitors (CN and CP) of the differential loop filter 406.

Three characteristic curves are plotted, reference labels 440, 442, and 444.

Without the phase offset circuit (Iph=Iph_p−Iph_n=0), and the clock and data recovery circuit locked on the incoming data, the sampling edge of the clock is in the eye center and the net charge (Qnet) on the filter capacitors CN and CP is zero (442). The phase offset circuit will introduce a positive or negative offset current Iph in the charge pump 404, forcing a phase error (+ph444, −ph440) in the sampling edge position to compensate for the offset current such that in the lock condition the net charge on the filter capacitors CN and CP, is zero.

The recovered clock sampling edge position (assuming the active edge is the rising edge) relative to the eye center for the three cases of FIG. 18 is shown in FIG. 19 "Sampling Edge with and without Applied Phase Offset".

FIG. 19 is a timing diagram showing three pulse shapes 450, 452, and 454, and indicating their zero-crossing points at −ph, eye center, and +ph respectively. The three pulse shapes 450, 452, and 454 correspond to the cases 440, 442, and 444 respectively of FIG. 18.

The Clock and Data Recovery circuit 110 with Phase Offset Control block 104 permits the clock sampling position to be controlled (by the Phase Offset Control signal 124) to optimize the sampling point to compensate for a distorted eye.

Thus, an improved differential receiver circuit with electronic dispersion compensation is provided, which is especially suitable for high speed applications such as dispersion compensation in fiber optics communications systems.

Although the high speed circuits for electronic dispersion compensation according to the embodiment of the invention have been illustrated using silicon bipolar technology, it is understood that other semiconductor technologies, e.g. MOSFET technology, may also be used. In certain cases it may require minor modifications to the circuits design. For example, when MOSFET technology is used, the linear to logarithmic and linear to exponential converters may not be required.

In another modification to the embodiment of the invention, the FFE circuit may be modified to use a tapped delay line with a different number of taps and multipliers, in which case the adders in the first layer of the summing tree must collectively have at least "n" inputs, and each subsequent layer of adders collectively has a sufficient number of adder inputs to connect to the adder inputs of the preceding layer.

Although specific embodiments of the invention have been described in detail, it will be apparent to one skilled in the art that variations and modifications to the embodiments may be made within the scope of the following claims.

What is claimed is:

1. A receiver circuit, comprising:
   a differential analog feed forward equalizer (FFE) circuit for receiving a dispersion distorted analog signal and processing the received signal to generate an equalized analog data signal (dispersion compensated signal);
   a differential clock and data recovery (CDR) circuit for receiving the equalized analog data signal and processing the received equalized analog data signal to generate a recovered clock signal, a decision feedback equalizer (DFE) sign control signal, and a retimed digital data signal;
   a differential analog slicing level control circuit providing a slicing level input signal to the CDR circuit for adding a static offset to the equalized analog data signal from the FFE;
   a differential analog DFE circuit processing the DFE sign control signal into a DFE feedback signal supplied to the CDR circuit for adding a dynamic offset to the equalized analog data signal;
   wherein the FEE is a finite impulse response (FIR) filter with adjustable tan weights, the tan weights having been set to substantially or partially provide dispersion compensation of the signal;
   wherein the differential slicing level control circuit has means for generating the slicing level input signal in the form of a differential current;
   wherein the DFE circuit has means for generating the DFE feedback signal in the form of a differential current, the polarity of said differential current being controlled by the DFE sign control signal; and,
   wherein the CDR circuit comprises:
      a data discriminator and a flip flop;
      the data discriminator receiving the equalized analog data signal from the FFE, the slicing level input signal and the DFE feedback signal. combining said three analog signals and processing them into a raw data signal which is a digital signal;
      the flip fan receiving said raw data signal and the recovered clock signal to generate the DFE Sign control signal and the retimed data signal.

2. A receiver circuit as described in claim 1, wherein the flip flop has a master stage and a slave stage; the master stage generating the DFE sign control signal, and the slave stage generating the retimed data signal.

3. A receiver circuit as described in claim 1, wherein the data discriminator comprises a comparator, an adder stage and a decision circuit;

the comparator converting the equalized analog data signal into a differential current;

said differential current being supplied to the adder stage along with the slicing level input signal and the DFE feedback signal, both in the form of the differential currents, an output of the adder stage being a differential analog voltage signal;

the decision circuit receiving said differential analog voltage signal and converting it into the raw data signal.

4. A receiver circuit as described in claim 3, wherein the adder stage comprises two resistors only, to which said differential currents are supplied to generate said differential analog voltage signal.

5. A receiver circuit as described in claim 1, wherein the DFE circuit comprises:

a switching means, and a first, second and third single ended current sources, the first and second current sources being connected in parallel;

the currents flowing through said current sources being controlled by a differential DFE weight signal, having first and second single ended signals, supplied from a corresponding first and second DFE weight terminal; the first current source being controlled by the first single ended DFE weight signal, and the second and third current sources being controlled by the second single ended DFE weight signal;

the differential DFE feedback signal being supplied to a first and a second DFE feedback terminal;

the switching means providing a connection between said current sources and the DFE feedback terminals in one of the first and second states, the states being selected by the DFE sign control signal.

6. A receiver circuit as described in claim 5, wherein in the first state the first and second current sources are connected to the first DFE feedback terminal, and the third current source is connected to the second DFE terminal; and in the second state the first and second current sources are connected to the second DFE feedback terminal, and the third current source is connected to the first DFE terminal.

7. A receiver circuit as described in claim 1, the circuit being formed on a single semiconductor substrate.

8. A receiver circuit as described in claim 1, the circuit being manufactured in bipolar technology.

9. A receiver circuit as described in claim 1, the circuit being manufactured in MOSFET technology.

10. A semiconductor device, comprising a receiver circuit as described in claim 1.

11. A receiver circuit as described in claim 1, the circuit being manufactured in an electronic package.

12. A circuit board, comprising a receiver circuit as described in claim 1.

13. A receiver circuit, comprising:

a differential analog feed forward equalizer (FFE) circuit for receiving a dispersion distorted analog signal and processing the received signal to generate an equalized analog data signal (dispersion compensated signal);

a differential clock and data recovery (CDR) circuit for receiving the equalized analog data signal and processing the received equalized analog data signal to generate a recovered clock signal, a decision feedback equalizer (DFE) sign control signal, a retimed digital data signal, and a phase offset enable signal;

a differential analog slicing level control circuit providing a slicing level input signal to the CDR circuit for adding a static offset to the equalized analog data signal from the FFE;

a differential analog DFE circuit processing the DFE sign control signal into a DFE feedback signal supplied to the CDR circuit for adding a dynamic offset to the equalized analog data signal; and a differential phase offset control circuit for adjusting the phase at which the equalized analog data signal is sampled by the CDR circuit in response to the phase offset enable signal.

14. A receiver circuit as described in claim 13, wherein the FFE circuit comprises:

a differential tapped delay line having a delay line input, "n–1" delay elements and "n" output taps, the delay line receiving the dispersion distorted analog signal at the delay line input and producing progressively delayed signals at the output taps;

"n" differential analog multipliers for multiplying the respective delayed signals with corresponding tap weights into "n" multiplied signals;

a balanced summing tree having a plurality of differential analog adders for summing said "n" multiplied signals into the equalized analog data signal at the output of the summing tree, which is the output of the FFE; the balanced summing tree being arranged so that each multiplied signal is passing through the same number of adders before reaching the output of the FFE.

15. A receiver circuit as described in claim 14, wherein the physical layout of the FFE circuit is arranged so that the propagation delay from each of the "n" output taps of the delay line to the FFE circuit output is substantially the same.

16. A receiver circuit as described in claim 15, wherein the phase offset control circuit comprises a means for generating a differential offset current proportional to a phase offset control signal and enabled by the phase offset enable signal.

17. A receiver circuit as described in claim 16, wherein the CDR circuit comprises means for generating the phase offset enable signal in the form of a pulse coincident with an edge of the retimed data signal.

18. A receiver circuit as described in claim 17, wherein the phase offset control circuit comprises a current source generating a single ended current; and a means for splitting the generated single ended current into two single ended currents, whose difference forms the differential offset current.

19. A receiver circuit as described in claim 18, wherein the differential slicing level control circuit has means for generating the slicing level input signal a the form of a differential current, and another means for generating the DFE feedback signal in the form of a differential current, the polarity of said differential current for the DFE feed back signal being controlled by the DFE sign control signal.

20. A receiver circuit as described in claim 19, the circuit being formed on a single semiconductor substrate and manufactured in one of the bipolar and MOSFET technology.

21. A receiver circuit, comprising:

a differential analog feed forward equalizer (FFE) circuit for receiving a dispersion distorted analog signal and processing the received signal to generate an equalized analog data signal (dispersion compensated signal);

a differential clock and data recovery (CDR) circuit for receiving the equalized analog data signal and processing the received equalized analog data signal to generate a recovered clock signal, a decision feedback equalizer (DFE) sign control signal, and a retimed digital data signal;

a differential analog slicing level control circuit providing a slicing level input signal to the CDR circuit for adding a static offset to the equalized analog data signal, from the FFE;

a differential analog DFE circuit processing the DFE sign control signal into a DFE feedback signal supplied to the CDR circuit for adding a dynamic offset to the equalized analog data signal;

wherein the FFE is a finite impulse response (FIR) filter with adjustable tap weights, the tap weights having been set to substantially or partially provide dispersion compensation of the signal;

wherein the differential slicing level control circuit has means for generating the slicing level input signal in the form of a differential current;

wherein the DFE circuit has means for generating the DFE feedback signal in the form of a differential current, the polarity of said differential current being controlled by the DFE sign control signal, the DFE circuit comprising:

a switching means, and a first, second and third single ended current sources, the first and second current sources being connected in parallel;

the currents flowing through said current sources being controlled by a differential DFE weight signal, having first and second single ended signals, supplied from a corresponding first and second DFE weight terminal; the first current source being controlled by the first single ended DFE weight signal, and the second and third current sources being controlled by the second single ended DFE weight signal;

the differential DFE feedback signal being supplied to a first and a second DYE feedback terminal;

the switching means providing a connection between said current sources and the DFE feedback terminals in one of the first and second states, the states being selected by the DYE sign control signal.

* * * * *